US009343863B2

(12) United States Patent
Nakamura et al.

(10) Patent No.: US 9,343,863 B2
(45) Date of Patent: May 17, 2016

(54) METHOD FOR MANUFACTURING MOUNT ASSEMBLY

(71) Applicant: OLYMPUS CORPORATION, Tokyo (JP)

(72) Inventors: Mikio Nakamura, Tokyo (JP); Takanori Sekido, Chofu (JP)

(73) Assignee: OLYMPUS CORPORATION, Tokyo (JP)

( * ) Notice: Subject to any disclaimer, the term of this patent is extended or adjusted under 35 U.S.C. 154(b) by 325 days.

(21) Appl. No.: 13/871,266

(22) Filed: Apr. 26, 2013

(65) Prior Publication Data

US 2013/0232781 A1   Sep. 12, 2013

Related U.S. Application Data

(62) Division of application No. 12/727,706, filed on Mar. 19, 2010, now abandoned.

(30) Foreign Application Priority Data

Mar. 19, 2009   (JP) .................. 2009-069076
Mar. 19, 2009   (JP) .................. 2009-069077

(51) Int. Cl.
*H01R 43/00*   (2006.01)
*H05K 3/34*    (2006.01)
*H05K 3/36*    (2006.01)

(52) U.S. Cl.
CPC ............. *H01R 43/00* (2013.01); *H05K 3/3405* (2013.01); *H05K 3/366* (2013.01); *H05K 3/368* (2013.01); *H05K 2201/1031* (2013.01);

(Continued)

(58) Field of Classification Search
CPC ..... H05K 3/00; H05K 5/0247; H05K 7/1452; H05K 3/3405; H05K 3/366; H05K 3/368; H05K 2201/1031; H05K 2201/10318; H05K 2201/1034; H05K 2201/10952; H05K 2201/10977; H01R 43/00; Y02P 70/611; Y10T 29/49117; Y10T 29/49208
See application file for complete search history.

(56) References Cited

U.S. PATENT DOCUMENTS 3,136,591 A     6/1964   Just et al.
3,747,209 A *   7/1973   Chow ........................ 29/860

(Continued)

FOREIGN PATENT DOCUMENTS

JP   S50-155561      12/1975
JP   S55-181371 U    12/1980

(Continued)

OTHER PUBLICATIONS

U.S. Non-Final Office Action dated Sep. 11, 2012 issued in corresponding U.S. Appl. No. 12/727,706.

(Continued)

*Primary Examiner* — Carl Arbes
(74) *Attorney, Agent, or Firm* — Scully, Scott, Murphy & Presser, P.C.

(57) ABSTRACT

A mount assembly includes a member in which a mount component is mounted at least on one main face of the member and at which a member connecting electrode is formed; and a connection member that has a pillar-shaped parallel portion arranged so that a longitudinal direction of the parallel portion is parallel to the main face of the member, one end side of the parallel portion being connected to the member connecting electrode.

4 Claims, 34 Drawing Sheets

(52) U.S. Cl.
CPC ........... *H05K 2201/1034* (2013.01); *H05K 2201/10318* (2013.01); *H05K 2201/10962* (2013.01); *H05K 2201/10977* (2013.01); *Y02P 70/611* (2015.11); *Y10T 29/49117* (2015.01); *Y10T 29/49208* (2015.01)

(56) References Cited

U.S. PATENT DOCUMENTS

| | | | |
|---|---|---|---|
| 3,916,513 A * | 11/1975 | Ballard | 29/827 |
| 4,044,460 A * | 8/1977 | Schachter | 29/842 |
| 4,044,888 A * | 8/1977 | Schachter | 206/717 |
| 5,433,618 A | 7/1995 | Morlion et al. | |
| 5,781,415 A | 7/1998 | Itoh | |
| 5,796,592 A | 8/1998 | Tanaka | |
| 5,823,795 A | 10/1998 | Schumacher | |
| 5,909,915 A | 6/1999 | Okuda | |
| 6,200,146 B1 | 3/2001 | Sarkissian | |
| 6,280,201 B1 | 8/2001 | Morris | |
| 6,469,255 B2 | 10/2002 | Watanabe et al. | |
| 6,641,407 B2 | 11/2003 | Murakami | |
| 6,843,657 B2 | 1/2005 | Driscoll et al. | |
| 7,112,067 B1 | 9/2006 | Korsunsky et al. | |
| 7,514,784 B2 | 4/2009 | Mayuzumi et al. | |
| 7,606,041 B2 | 10/2009 | Park | |
| 2006/0118330 A1 | 6/2006 | Ooyabu et al. | |

FOREIGN PATENT DOCUMENTS

| | | |
|---|---|---|
| JP | S56-162673 U | 12/1981 |
| JP | H04-134874 U | 12/1992 |
| JP | 05-291724 A | 11/1993 |
| JP | H06-72249 U | 10/1994 |
| JP | H08-162570 A | 6/1996 |
| JP | H10-308580 A | 11/1998 |
| JP | 2001-168493 A | 6/2001 |
| JP | 2007-194160 A | 8/2007 |
| WO | 2006/035528 A1 | 4/2006 |

OTHER PUBLICATIONS

U.S. Final Office Action dated Jan. 28, 2013 issued in corresponding U.S. Appl. No. 12/727,706.
Japanese Office Action dated Jan. 8, 2013 issued in corresponding Application No. 2009-069076 together with an English Language Translation.
Japanese Office Action dated Jan. 22, 2013 issued in corresponding Application No. 2009-069077 together with an English Language Translation.
Japanese Office Action dated Dec. 24, 2014 from related Japanese Application No. 2013-244247, together with an English language translation.
Japanese Office Action dated Nov. 17, 2015 from related Japanese Patent Application No. 2015-056772, together with an English language translation.

* cited by examiner

METHOD FOR MANUFACTURING MOUNT ASSEMBLY

CROSS-REFERENCE TO RELATED APPLICATIONS

This application is a Divisional application of U.S. Ser. No. 12/727,706, filed on Mar. 19, 2010, which is based upon and claims the benefit of priority from Japanese Patent Application No. 2009-069076, filed on Mar. 19, 2009 and Japanese Patent Application No. 2009-069077, filed on Mar. 19, 2009, the entire contents of each of which are incorporated herein by reference.

BACKGROUND OF THE INVENTION

1. Field of the Invention

The present invention relates to a mount assembly and a method for manufacturing the mount assembly.

2. Description of the Related Art

In the related art, an endoscope to perform observation of a subject portion as being inserted into a body cavity of a subject has been known and widely utilized in a medical field and the like. Such an endoscope is configured to incorporate an electronic circuit module having electronic components such as an imaging element mounted at the distal end of an elongated flexible insertion device. In order to ease pain of a patient, the distal end of the insertion device has been desired to be thinned and miniaturized. Accordingly, a variety of technologies to miniaturize the electronic circuit module incorporated in the distal end has been disclosed.

Meanwhile, Japanese Laid-open Patent Publication No. 2007-194160 discloses a method for connecting printed substrates in the mutually perpendicular direction. In Japanese Laid-open Patent Publication No. 2007-194160, the printed substrates are mechanically and electrically connected by inserting a protrusion formed at one printed substrate into a hole formed at the other printed substrate.

Further, in Japanese Laid-open Patent Publication No. 05-291724, component-mounting units are arranged to be perpendicular to a mount substrate face by arranging the component mounting units on a flexible substrate to be alternated between front and rear sides and folding wiring portions for connecting the respective component-mounting units.

SUMMARY OF THE INVENTION

A mount assembly according to an aspect of the present invention includes a member in which a mount component is mounted at least on one main face of the member and at which a member connecting electrode is formed; and a connection member that has a pillar-shaped parallel portion arranged so that a longitudinal direction of the parallel portion is parallel to the main face of the member, one end side of the parallel portion being connected to the member connecting electrode.

A mount assembly according to another aspect of the present invention includes a plurality of substrates of which main faces are arranged to be mutually parallel; an inter-substrate connection member which connects the substrates; and an inter-member connection member, on a substrate main face of at least one substrate, which has a pillar-shaped parallel portion having the longitudinal direction thereof arranged to be parallel to the substrate main face and having the other end side thereof arranged to be extended to an end of the member main face, and of which one end side is connected to a member connecting electrode formed on the substrate main face.

A method for manufacturing a mount assembly according to still another aspect of the present invention includes an electrode forming step of forming a member connecting electrode on a main face of a member to which a mount component is mounted for each area to be cut and separated so as to be opposed to each other sandwiching a cutting position; a connecting step of arranging a connection member having a pillar-shaped portion which forms a parallel portion between the opposed member connecting electrodes formed in the electrode forming step so that the pillar-shaped portion is parallel to the main face of the member and to connect both end sides of the pillar-shaped portion respectively to the opposed member connecting electrodes; and an individuating step of dividing the member by cutting at the cutting position.

The above and other features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

In the following, preferred embodiments of the present invention will be described in detail with reference to the drawings. Here, the present invention is not limited to these embodiments.

Figure 1:
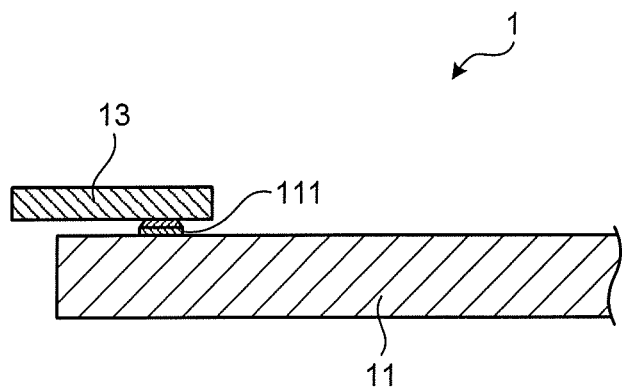
FIG. 1 is a partial sectional view which illustrates an example of a mount assembly of a first embodiment.
Figure 2:
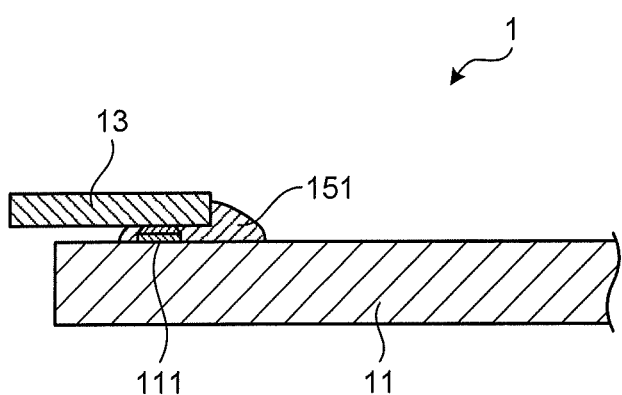
FIG. 2 is a partial sectional view which illustrates an example of the mount assembly of the first embodiment.

FIGS. 1 and 2 are partial sectional views illustrating an example of a mount assembly 1 of the first embodiment. As illustrated in FIG. 1, the mount assembly 1 of the first embodiment includes a substrate 11 as a member and a connection member 13. Mount components as electronic components such as electronic circuits (not illustrated) are mounted on the upper face as a main face of the substrate 11, and then, a member connecting electrode 111 is formed at a predetermined position at one end side of the upper face while avoiding the mount components. Meanwhile, the connection member 13 constituted with a single pillar-shaped member is formed of conductive material and forms a parallel portion. That is, the connection member 13 is arranged so that the longitudinal direction thereof is parallel to the substrate 11 as a side face of one end of the connection member 13 being contacted to the member connecting electrode 111 and the other end thereof is extended to the outside of the one end of the upper face of the substrate 11. The connection member 13 is formed to have length determined by the distance from the member connecting electrode 111 to the one end of the substrate 11.

When manufacturing the mount assembly 1, the connection member 13 is placed so that the longitudinal direction thereof is parallel to the main face of the substrate 11, and then, the side face of the one end of the connection member 13 is contacted and connected to the member connecting electrode 111 by soldering and the like, for example. Subsequently, as illustrated in FIG. 2, the vicinity of the connecting part between the member connecting electrode 111 and the connection member 13 is fixed and protected by being sealed with a resin 151 as a reinforcing member. With this configuration, reliability of the mount assembly 1 can be improved and handling as a component can be eased.

Figure 3:
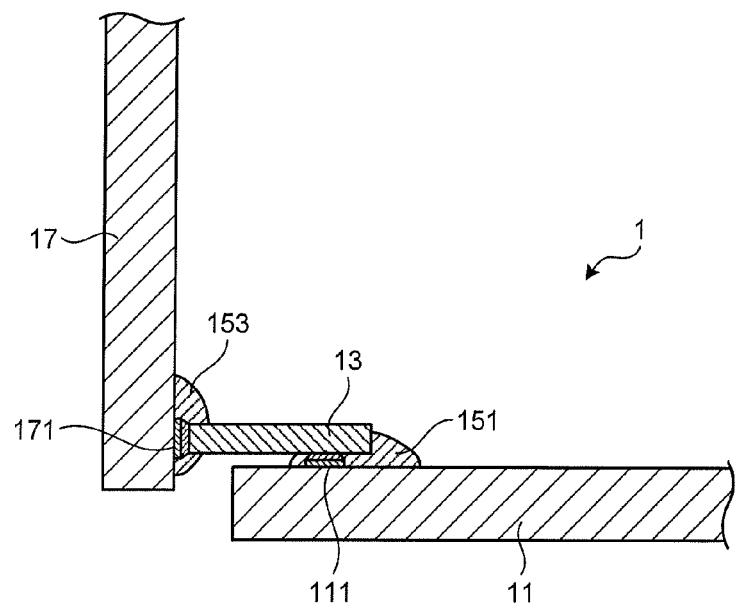
FIG. 3 is a partial sectional view which illustrates a state that a substrate is connected to the mount assembly of the first embodiment.

FIG. 3 is a partial sectional view illustrating a state that a substrate 17 as another member is connected to the mount assembly 1. The substrate 17 is arranged so that the right side face in FIG. 3 as a main face is directed to the substrate 11 side and the main face thereof is perpendicular to the main face of the substrate 11 at the outside of the one end of the substrate 11. Then, a mount assembly connecting electrode 171 is formed at a predetermined position of the right side face of the substrate 17 and is contacted and connected to the other end face of the connection member 13 extended to the outside of the one end of the substrate 11 by soldering and the like. In this manner, the member connecting electrode 111 and the mount assembly connecting electrode 171 are connected, so that the mount assembly 1 and the substrate 17 are mechanically and electrically connected. Further, the vicinity of the connecting part between the mount assembly connecting electrode 171 and the connection member 13 is fixed and protected by being sealed with a resin 153.

As described above, according to the mount assembly 1 of the first embodiment, it is possible to arrange the connection member 13 constituted with the single pillar-shaped member to be parallel to the main face of the substrate 11, while one end thereof is connected to the member connecting electrode 111 which is formed at the main face of the substrate 11 and the other end is extended to the outside of the one end of the upper face of the substrate 11. In addition, another member such as the substrate 17 which is arranged at the other end of the parallel portion so that the main face thereof is perpendicular to the main face of the substrate 11 can be connected. Accordingly, since it is only needed to connect the conductive connection member 13 to the member connecting electrode 111 on the substrate 11 without performing special processing on respective members to be connected, other members can be easily connected in high density. In addition, the member connecting electrode 111 and the mount assembly connecting electrode 171 can be connected with the pillar-shaped connection member 13. At that time, it is also possible that the diameter of the connection member 13 is appropriately enlarged in consideration of the space on the substrate 11. Accordingly, compared to a case of forming a wiring pattern on a substrate for connection, reliable connection can be actualized at low resistance.

Figure 4:
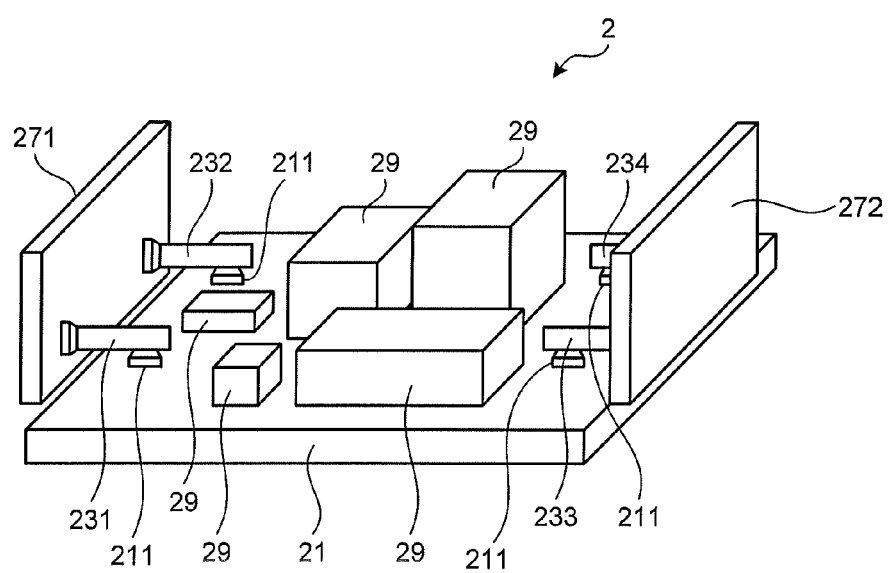
FIG. 4 is a schematic perspective view which schematically illustrates the entire configuration of an electronic circuit module including the mount assembly of the first embodiment.

FIG. 4 is a schematic perspective view which schematically illustrates the entire configuration of an electronic circuit module 2 including the mount assembly of the first embodiment. The electronic circuit module 2 in FIG. 4 is provided with a plurality (i.e., five in the example of FIG. 4) of mount components 29 mounted on the upper face as a main face. In addition, the electronic circuit module 2 is provided with a substrate 21 having a plurality (i.e., four in the example of FIG. 4) of member connecting electrodes 211 formed at ends of short sides thereof and four connection members 231 to 234 having the longitudinal direction thereof arranged to be parallel to the main face of the substrate 21 and having one end respectively connected to the member connecting electrodes 211. In this manner, the electronic circuit module 2 includes the mount assembly described in the first embodiment. Then, two substrates 271, 272 are arranged at the outside of the respective short sides of the substrate 21 so that the main faces thereof are directed to the substrate 21 side and are perpendicular to the main face of the substrate 21. The substrate 271 is connected by the connection members 231, 232 and the substrate 272 is connected by the connection members 233, 234. Accordingly, in the electronic circuit module 2 including the mount assembly of the first embodiment, it is possible to mount the substrates 271, 272 as other members on the mount assembly in high density. Here, not limited to the short side of the substrate 21, it is also possible that the member connecting electrode is formed at the end of a long side and another member such as a substrate is connected to the outside thereof.

Figure 5:
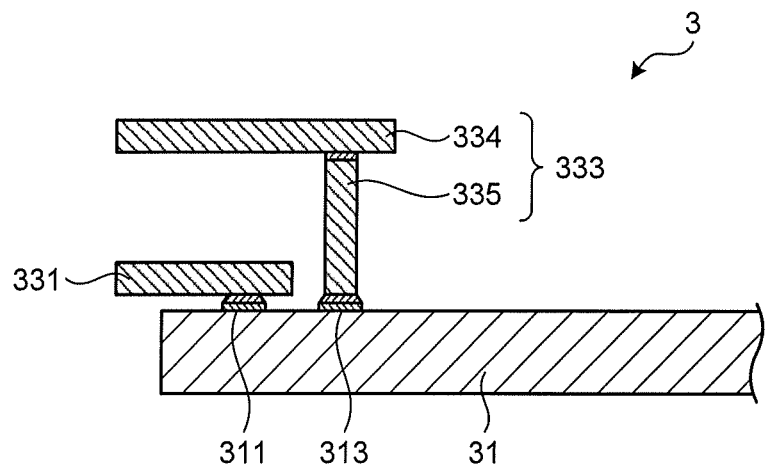
FIG. 5 is a partial sectional view which illustrates an example of a mount assembly of a second embodiment.
Figure 6:
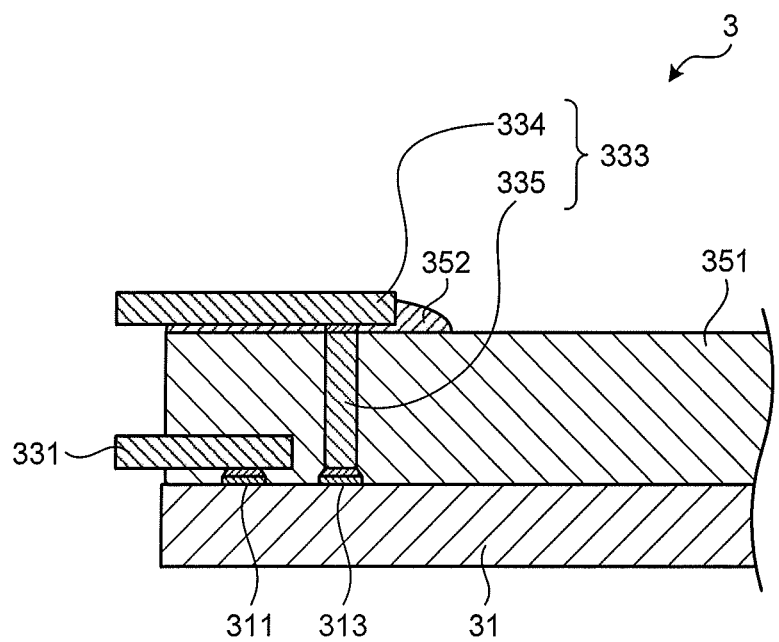
FIG. 6 is a partial sectional view which illustrates an example of the mount assembly of the second embodiment.

FIGS. 5 and 6 are partial sectional views illustrating an example of a mount assembly 3 of the second embodiment.

As illustrated in FIG. 5, the mount assembly 3 of the second embodiment includes a substrate 31 and two types of connection members 331, 333. Mount components (not illustrated) are mounted on the upper face as a main face of the substrate 31, and then, member connecting electrodes 311, 313 are formed at predetermined positions at one end side of the upper face while avoiding the mount components.

The connection member 331 is configured to be similar to the connection member 13 of the first embodiment. That is, the connection member 331 is arranged so that the longitudinal direction thereof is parallel to the substrate 31 as a side face of one end of the connection member 331 being contacted to the member connecting electrode 311 and the other end thereof is extended to the outside of the one end of the substrate 31. Meanwhile, the connection member 333 is constituted with a first pillar-shaped member 334 and a second pillar-shaped member 335 which are formed of conductive material respectively. The connection member 333 has an approximately L-shaped external shape in a state that one end face of the second pillar-shaped member 335 which supports the first pillar-shaped member 334 is connected to a side face of one end of the first pillar-shaped member 334 forming a parallel portion. The other end face of the second pillar-shaped member 335 of the connection member 333 is connected to the member connecting electrode 313. Then, the first pillar-shaped member 334 is arranged so that the longitudinal direction thereof is parallel to the main face of the substrate 31 and the other end thereof is extended to the outside of the one end of the substrate 31. Here, the length of the second pillar-shaped member 335 is determined so that the parallel portions of the respective connection members 331, 333 which are arranged one above the other (i.e., the connection member 331 and the first pillar-shaped member 334 of the connection member 333) are not mutually contacted, in accordance with the position of a mount assembly connecting electrode of another member to be connected to the member connecting electrode 313 by the connection member 333 (i.e., in accordance with the height of the mount assembly connecting electrode of another member against the position of the main face of the substrate 31).

When manufacturing the mount assembly 3, the connection member 331 is placed so that the longitudinal direction thereof is parallel to the main face of the substrate 31, and then, the side face of the one end of the connection member 331 is contacted and connected to the member connecting electrode 311 by soldering and the like, for example. Further, the other end face of the second pillar-shaped member 335 is connected to the member connecting electrode 313 as being vertically arranged thereon. Subsequently, the first pillar-shaped member 334 is placed so that the longitudinal direction thereof is parallel to the main face of the substrate 31, and then, the side face of the one end thereof is contacted to the one end face of the second pillar-shaped member 335 and connected thereto via a metallic film. Here, it is also possible that the side face of the one end of the first pillar-shaped member 334 and the one end face of the second pillar-shaped member 335 are previously connected by soldering and the like.

In addition, similar to the first embodiment, it is also possible that the vicinity of the connecting part between the substrate 31 and the respective connection members 331, 333 is fixed and protected by being sealed with resin. For example, as illustrated in FIG. 6, a protection layer 351 is formed by filling resin onto the substrate 31 after the other end face of the second pillar-shaped member 335 is connected to the member connecting electrode 313 as being vertically arranged while connecting the connection member 331 to the member connecting electrode 311. Further, after the one end face of the second pillar-shaped member 335 is exposed and connected to the side face of the one end of the first pillar-shaped member 334, the vicinity of the connecting part between the first pillar-shaped member 334 and the second pillar-shaped member 335 is sealed with a resin 352.

Figure 7:
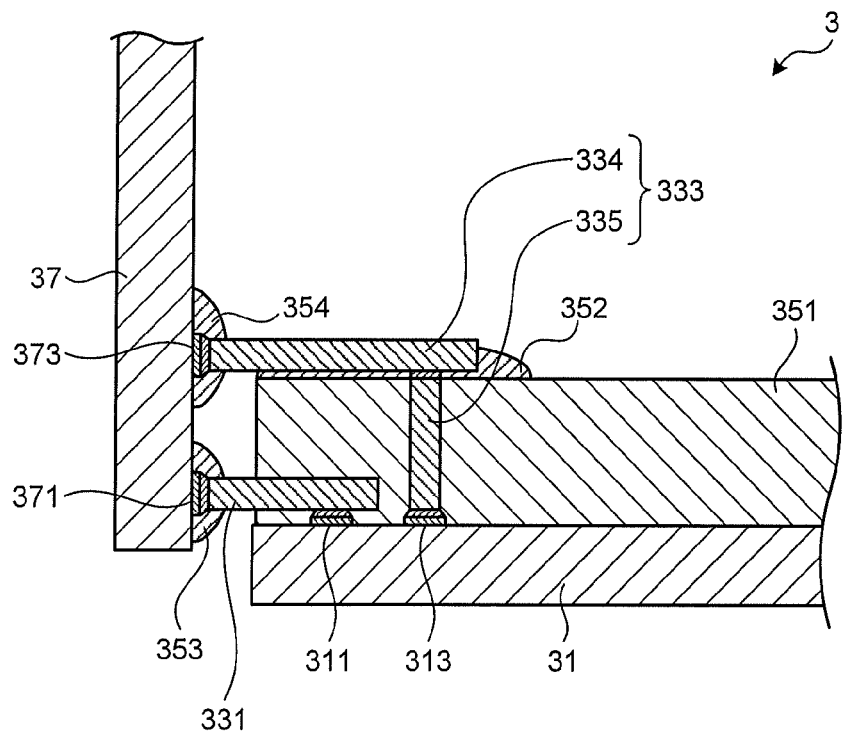
FIG. 7 is a partial sectional view which illustrates a state that a substrate is connected to the mount assembly of the second embodiment.

FIG. 7 is a partial sectional view illustrating a state that a substrate 37 as another member is connected to the mount assembly 3. The substrate 37 is arranged so that the right side face in FIG. 7 as a main face thereof is directed to the substrate 31 side and the main face thereof is perpendicular to the main face of the substrate 31 at the outside of one end of the substrate 31. Then, mount assembly connecting electrodes 371, 373 are formed at predetermined positions of the right side face of the substrate 37 and are contacted and connected respectively to the other end faces of the connection members 331, 333 extended to the outside of the one end of the substrate 31 by soldering and the like. In this manner, the member connecting electrode 311 and the mount assembly connecting electrode 371 are connected and the member connecting electrode 313 and the mount assembly connecting electrode 373 are connected, so that the mount assembly 3 and the substrate 37 are mechanically and electrically connected. Further, the vicinity of the connecting part between the mount assembly connecting electrode 371 and the connection member 331 is sealed with a resin 353 and the vicinity of the connecting part between the mount assembly connecting electrode 373 and the connection member 333 is sealed with a resin 354, so that the vicinities of the connection parts are fixed and protected.

As described above, according to the mount assembly 3 of the second embodiment, it is possible to constitute the connection member 333 having predetermined height by adjusting the length of the second pillar-shaped member 335 while obtaining similar effects to those of the first embodiment. In addition, by utilizing it in combination with the pillar-shaped connection member 331, the connection can be achieved with overlapped arrangement of the parallel portions not to be mutually contacted. Accordingly, since the space above the substrate 31 can be effectively utilized, design flexibility is increased.

Here, not limited to the case of combining the connection members 331, 333, it is also possible to utilize combination of connection members which are respectively configured to have different height of the parallel portion against the main face of the substrate 31 with second pillar-shaped members of different length.

Figure 8:
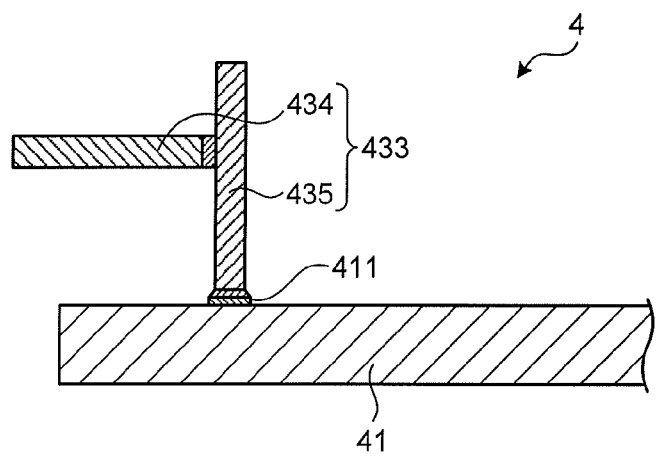
FIG. 8 is a partial sectional view which illustrates an example of a mount assembly of a third embodiment.
Figure 9:
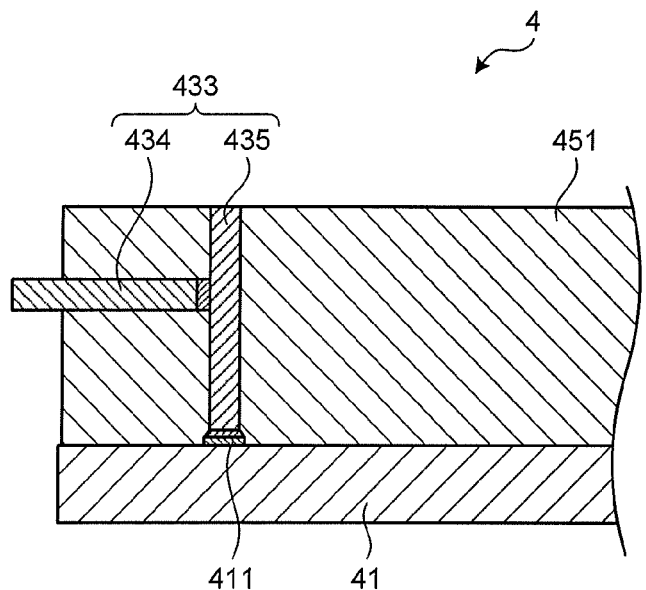
FIG. 9 is a partial sectional view which illustrates an example of the mount assembly of the third embodiment.

FIGS. 8 and 9 are partial sectional views illustrating an example of a mount assembly 4 of the third embodiment. As illustrated in FIG. 8, the mount assembly 4 of the third embodiment includes a substrate 41 and a connection member 433. Mount components (not illustrated) are mounted on the upper face as a main face of the substrate 41, and then, a member connecting electrode 411 is formed at a predetermined position at one end side of the upper face while avoiding the mount components. Meanwhile, the connection member 433 is constituted with a first pillar-shaped member 434 and a second pillar-shaped member 435 which are formed of conductive material respectively. One end face of the first pillar-shaped member 434 is connected to a side face of the second pillar-shaped member 435. One end face of the second pillar-shaped member 435 is contacted to the member connecting electrode 411. Then, the first pillar-shaped member 434 is arranged so that the longitudinal direction thereof is parallel to the main face of the substrate 41 and the other end thereof is extended to the outside of the one end of the substrate 41. Here, the connecting position of the first pillar-shaped member 434 with respect to the second pillar-shaped member 435 is determined in accordance with the position of a mount assembly connecting electrode of another member to be connected to the member connecting electrode 411 by the connection member 433 (i.e., in accordance with the height of the mount assembly connecting electrode of another member against the main face position of the substrate 41), for example.

When manufacturing the mount assembly 4, the one end face of the first pillar-shaped member 434 is previously connected to the side face of the second pillar-shaped member 435 via a metallic film, for example. Then, the first pillar-shaped member 434 is placed so that the longitudinal direction thereof is parallel to the main face of the substrate 41 and the other end thereof is extended to the outside of the one end of the substrate 41. Subsequently, the one end face of the second pillar-shaped member 435 is connected to the member connecting electrode 411 as being vertically arranged thereon. Here, similar to the first embodiment, the vicinity of the connecting part may be fixed and protected by sealing the connecting part between the substrate 41 and the connection member 433 with resin. For example, as illustrated in FIG. 9, a protection layer 451 is formed by filling resin onto the substrate 41 after the second pillar-shaped member 435 is connected to the member connecting electrode 411.

Figure 10:
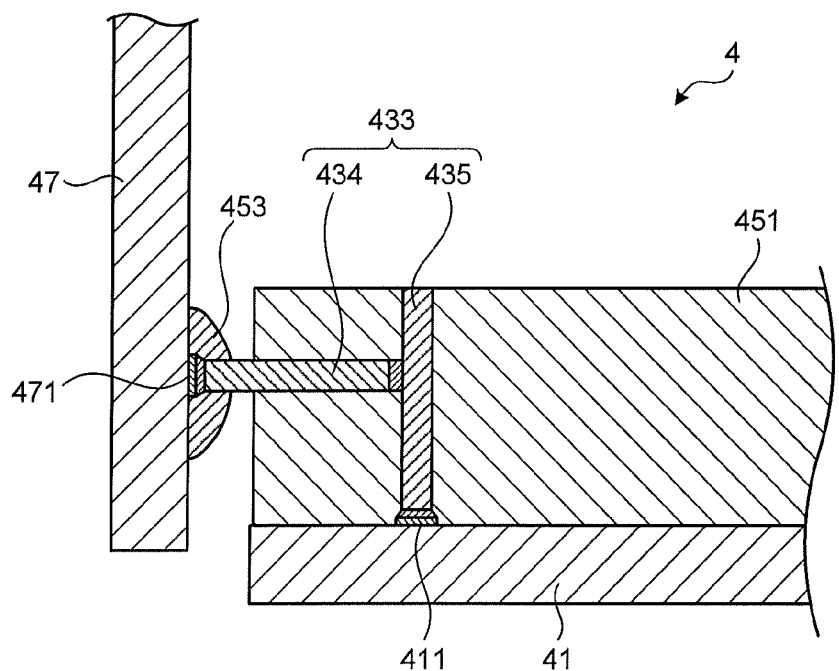
FIG. 10 is a partial sectional view which illustrates a state that a substrate is connected to the mount assembly of the third embodiment.

FIG. 10 is a partial sectional view illustrating a state that a substrate 47 as another member is connected to the mount assembly 4. The substrate 47 is arranged so that the right side face in FIG. 10 as a main face thereof is directed to the substrate 41 side and the main face thereof is perpendicular to the main face of the substrate 41 at the outside of the one end of the substrate 41. Then, a mount assembly connecting electrode 471 is formed at a predetermined position of the right side face of the substrate 47 and is contacted and connected to the other end face of the connection member 433 extended to the outside of the one end of the substrate 41 by soldering and the like. In this manner, the member connecting electrode 411 and the mount assembly connecting electrode 471 are connected, so that the mount assembly 4 and the substrate 41 are mechanically and electrically connected. Further, the vicinity of the connecting part between the mount assembly connecting electrode 471 and the connection member 433 is sealed with a resin 453, so that the vicinity of the connecting part is fixed and protected.

As described above, according to the mount assembly 4 of the third embodiment, similar effects to those of the first embodiment can be obtained. In addition, the height of the parallel portion (i.e., the first pillar-shaped member 434) against the main face of the substrate 41 can be adjusted by adjusting the connecting position of the first pillar-shaped member 434 against the second pillar-shaped member 435. Accordingly, it is not necessary to form the second pillar-shaped member having different length for height adjustment unlike the second embodiment, so that cost can be reduced.

Here, not limited to the case of utilizing one type of the connection member 433, it is also possible to utilize it in combination with the connection members described in the first and second embodiments. In this case, the connecting position of the first pillar-shaped member against the second pillar-shaped member is adjusted so as not cause mutual contacting of the parallel portions. Further, it is also possible to utilize combination of connection members which are respectively configured to have different height of the parallel portion against the main face of the substrate 41 by differently arranging the connecting position of the first pillar-shaped member against the second pillar-shaped member.

Figure 11:
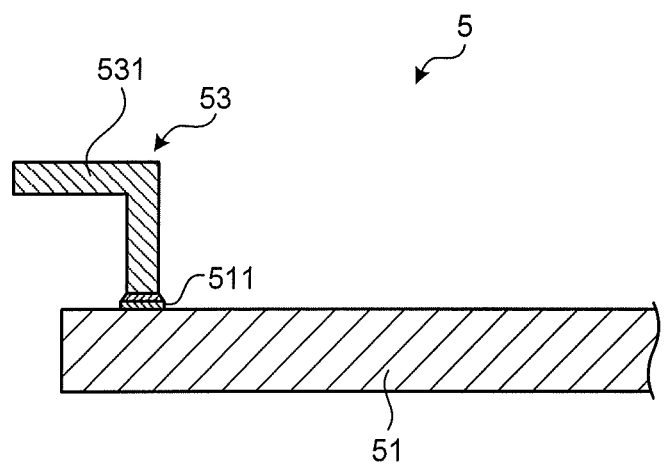
FIG. 11 is a partial sectional view which illustrates an example of a mount assembly of a fourth embodiment.
Figure 12:
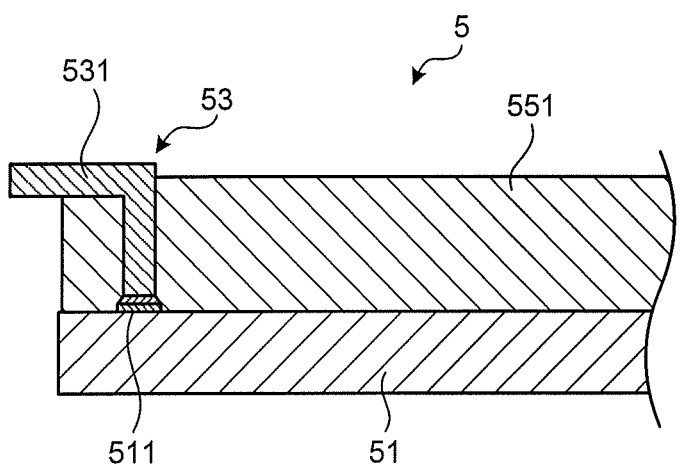
FIG. 12 is a partial sectional view which illustrates an example of the mount assembly of the fourth embodiment.

FIGS. 11 and 12 are partial sectional views illustrating an example of a mount assembly 5 of the fourth embodiment. As illustrated in FIG. 11, the mount assembly 5 of the fourth embodiment includes a substrate 51 and a connection member 53. Mount components (not illustrated) are mounted on the upper face as a main face of the substrate 51, and then, a member connecting electrode 511 is formed at a predetermined position at one end side of the upper face while avoiding the mount components. Meanwhile, the connection member 53 is configured to integrate the first and second pillar-shaped members which constitute the connection member 333 of the second embodiment or the connection member 433 of the third embodiment. In the example of FIG. 11, the connection member 53 has an L-shaped external shape obtained by bending a single pillar-shaped member formed of conductive material at a midpoint to form a parallel portion 531. Then, the connection member 53 is arranged so that the proximal end thereof is contacted to the member connecting electrode 511, the parallel portion 531 is parallel to the main face of the substrate 51 and the distal end thereof is extended to the outside of the one end of the substrate 51. Here, the length from the proximal end to the midpoint of the connection member 53 is determined in accordance with the position of a mount assembly connecting electrode of another member to be connected to the member connecting electrode 511 by the connection member 53 (i.e., in accordance with the height of the mount assembly connecting electrode of another member against the main face position of the substrate 51).

When manufacturing the mount assembly 5, the parallel portion 531 of the connection member 53 is arranged to be parallel to the substrate 51. Then, the proximal end of the parallel portion 531 is connected to the member connecting electrode 511 as being vertically arranged thereon so that the distal end thereof is extended to the outside of the one end of the substrate 51. Here, similar to the first embodiment, the vicinity of the connecting part may be fixed and protected by sealing the connecting part between the substrate 51 and the connection member 53 with resin. For example, as illustrated in FIG. 12, a protection layer 551 is formed by filling resin onto the substrate 51 after the proximal end of the connection member 53 is connected to the member connecting electrode 511.

Figure 13:
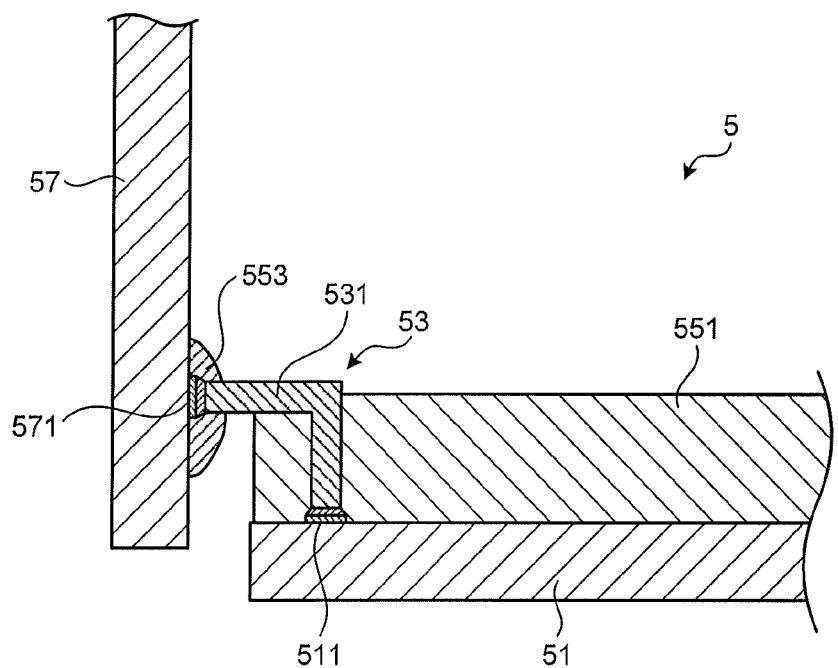
FIG. 13 is a partial sectional view which illustrates a state that a substrate is connected to the mount assembly of the fourth embodiment.

FIG. 13 is a partial sectional view illustrating a state that a substrate 57 as another member is connected to the mount assembly 5. The substrate 57 is arranged so that the right side face in FIG. 13 as a main face thereof is directed to the substrate 51 side and the main face thereof is perpendicular to the main face of the substrate 51 at the outside of the one end of the substrate 51. Then, a mount assembly connecting electrode 571 is formed at a predetermined position of the right side face of the substrate 57 and is contacted and connected to the other end face of the connection member 53 extended to the outside of the one end of the substrate 51 by soldering and the like. In this manner, the member connecting electrode 511 and the mount assembly connecting electrode 571 are connected, so that the mount assembly 5 and the substrate 57 are mechanically and electrically connected. Further, the vicinity of the connecting part between the mount assembly connecting electrode 571 and the connection member 53 is sealed with a resin 553, so that the vicinity of the connecting part is fixed and protected.

As described above, according to the mount assembly 5 of the fourth embodiment, similar effects to those of the first embodiment can be obtained. In addition, it is not necessary to connect the first and the second pillar-shaped members which are formed separately, unlike the second and third embodiments. Accordingly, the process to connect the first and second pillar-shaped members becomes unnecessary while decreasing the number of parts, so that the number of processes of manufacturing may be decreased. Therefore, manufacturing the mount assembly 5 can be performed more easily.

Here, not limited to the case of utilizing one type of the connection member 53, it is also possible to utilize it in combination with the connection members described in the first to third embodiments. In this case, the length from the proximal end to the midpoint is adjusted so as not cause mutual contacting of the parallel portions. Further, it is also possible to utilize combination of connection members which are configured to have different height of the parallel portion against the main face of the substrate 51 by differently arranging the length from the proximal end to the midpoint.

Figure 14:
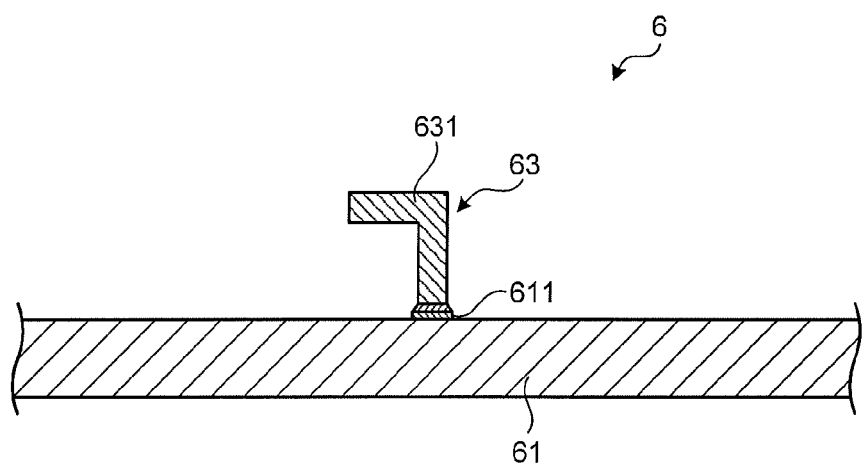
FIG. 14 is a partial sectional view which illustrates an example of a mount assembly of a fifth embodiment.

FIG. 14 is a partial sectional view illustrating an example of a mount assembly 6 of the fifth embodiment. As illustrated in FIG. 14, the mount assembly 6 of the fifth embodiment includes a substrate 61 and a connection member 63 which is configured to be similar to the connection member 53 of the fourth embodiment. Mount components (not illustrated) are mounted on the upper face as a main face of the substrate 61, and then, a member connecting electrode 611 is formed at a predetermined position at one end side of the upper face while avoiding the mount components. Meanwhile, the connection member 63 is arranged so that the proximal end is contacted to the member connecting electrode 611 and the longitudinal direction of a parallel portion 631 is parallel to the substrate 61, as similar to the fourth embodiment. However, in the fifth embodiment, the distal end of the parallel portion 631 is located above the substrate 61.

Figure 15:
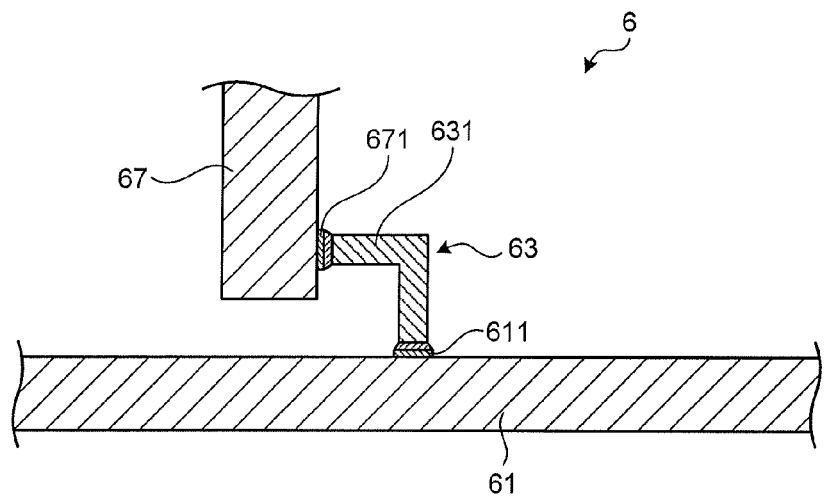
FIG. 15 is a partial sectional view which illustrates a state that a substrate is connected to the mount assembly of the fifth embodiment.

FIG. 15 is a partial sectional view illustrating a state that a substrate 67 as another member is connected to the mount assembly 6. The substrate 67 is arranged so that a main face thereof is perpendicular to the main face of the substrate 61 above the substrate 61. Then, a mount assembly connecting electrode 671 is formed at a predetermined position of the right side face of the substrate 67 in FIG. 15 as the main face thereof and is contacted and connected to the other end face of the connection member 63 extended to the outside of the one end of the substrate 61 by soldering and the like. In this manner, the member connecting electrode 611 and the mount assembly connecting electrode 671 are connected, so that the mount assembly 6 and the substrate 67 are mechanically and electrically connected. Here, not illustrated in the drawings, the vicinity of the connecting part between the mount assembly connecting electrode 671 and the connection member 63 may be sealed with resin.

As described above, according to the fifth embodiment, it is possible to connect the substrate 67 at the inside of the mount assembly 6 so that the main face thereof is arranged to be perpendicular to the main face of the substrate 61 while obtaining similar effects to those of the fourth embodiment. Therefore, it is possible to actualize the mount assembly 6 having other members such as the substrate 67 connected thereto in higher density. Here, the above description is performed on the case that the connection member constituted as in the fourth embodiment is applied. However, the connection members having other configurations described in the first to third embodiments may be similarly applied.

Figure 16:
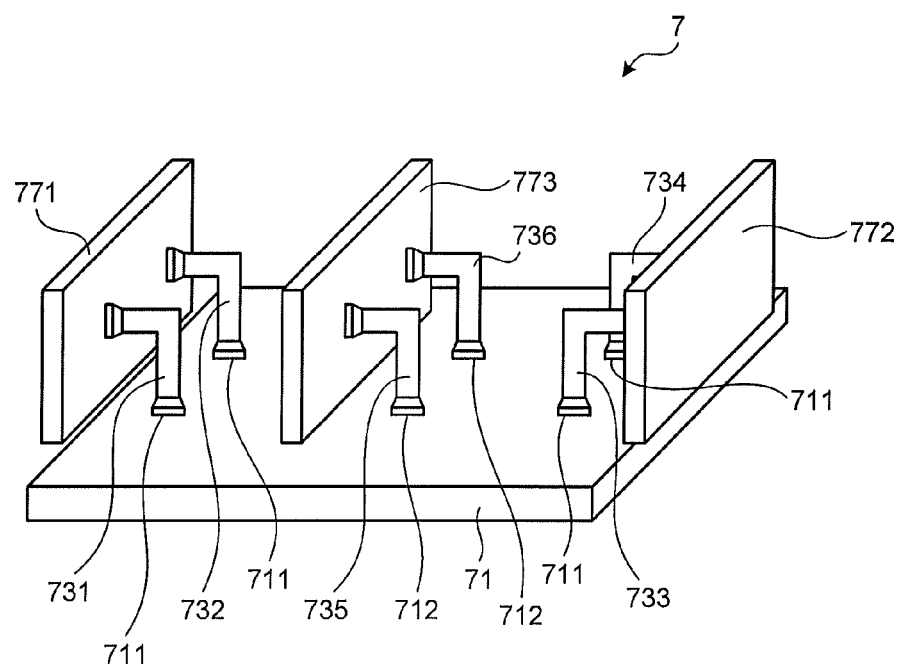
FIG. 16 is a schematic perspective view which schematically illustrates the entire configuration of an electronic circuit module including the mount assembly of the fifth embodiment.

FIG. 16 is a schematic perspective view which schematically illustrates the entire configuration of an electronic circuit module 7 including the mount assembly of the fifth embodiment. The electronic circuit module 7 in FIG. 16 is provided with a substrate 71 having a plurality of member connecting electrodes 711 formed at short side ends of the upper face as a main face (i.e., two each at both short side ends in the example of FIG. 16) and having a plurality of member connecting electrodes 712 (i.e., two in the example of FIG. 16) formed at predetermined positions at the center thereof. In addition, the electronic circuit module 7 includes connection members 731 to 736 connected to the respective member connecting electrodes 711, 712 at the proximal ends thereof and includes the mount assembly of the fifth embodiment. Two substrates 771, 772 are arranged at the outside of respective short sides of the substrate 71 so that respective main faces thereof are perpendicular to the main face of the substrate 71. The substrate 771 is connected by the connection members 731, 732 and the substrate 772 is connected by the connection members 733, 734. Further, one substrate 773 is arranged on the substrate 71 so that a main face thereof is perpendicular to the main face of the substrate 71 and the substrate 773 is connected by the connection members 735, 736. Here, since mount components (not illustrated) are mounted on the substrate 71, the substrate 773 is connected while avoiding the mount components. In this manner, according to the electronic circuit module 7 including the mount assembly of the fifth embodiment, other members such as the substrate 773 can be connected to the inside of the mount assembly (i.e., above the substrate 71) as well, so that the space above the substrate 71 can be effectively utilized. Therefore, it is possible to configure the electronic circuit module 7 to mount the substrates 771, 772, 773 as other members against the mount assembly in higher density. Here, not limited to the short side of the substrate 71, it is also possible to form member connecting electrodes at an end of the long side and to connect other members such as a substrate at the outside thereof.

Figure 17:
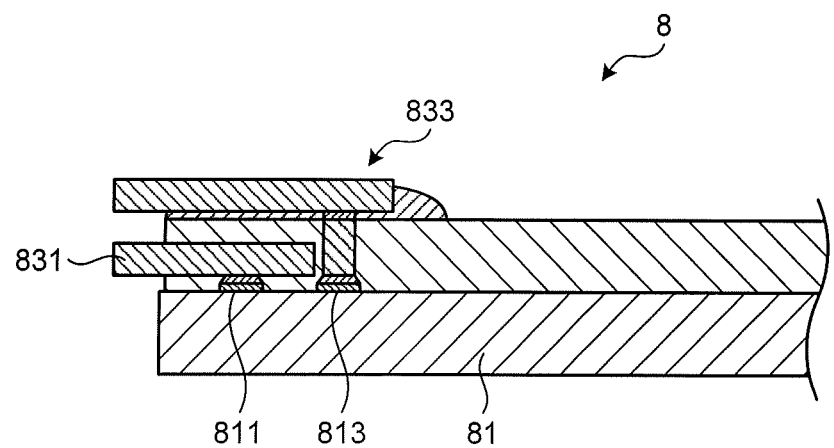
FIG. 17 is a partial sectional view which illustrates an example of a mount assembly of a sixth embodiment.
Figure 18:
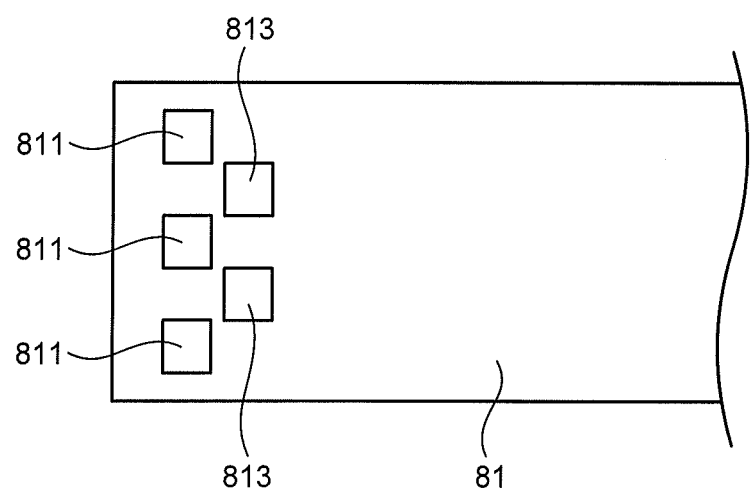
FIG. 18 is an explanatory view which illustrates position arrangement of member connecting electrodes formed on a substrate constituting the mount assembly of the sixth embodiment.
Figure 19:
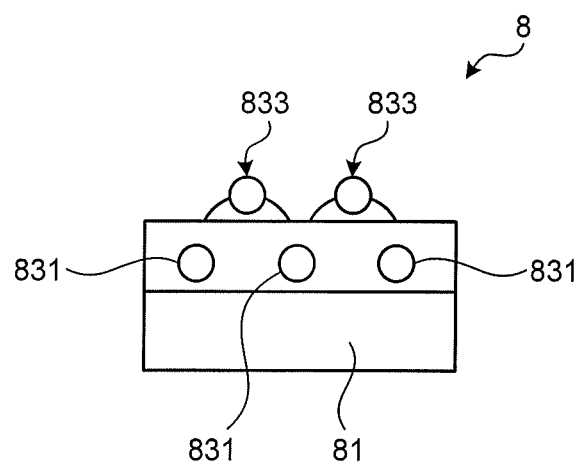
FIG. 19 is a side view of the mount assembly of the sixth embodiment viewing from one end side of the substrate.

FIG. 17 is a partial sectional view illustrating an example of a mount assembly 8 of the sixth embodiment. FIG. 18 is an explanatory view illustrating position arrangement of member connecting electrodes 811, 813 formed on a substrate 81. FIG. 19 is a side view of the mount assembly viewing from one end side of the substrate 81. As illustrated in FIG. 17, the mount assembly 8 of the sixth embodiment includes the substrate 81 and two types of connection members 831, 833. Here, mount components (not illustrated) are mounted at the upper face as a main face of the substrate 81 and member connecting electrodes 811, 813 are formed at predetermined positions of the one end side of the upper face while avoiding the mount components. Specifically, as illustrated in FIG. 18, a plurality (i.e., five in total in the example of FIG. 18) of member connecting electrodes 811, 813 arranged adjacently in two lines are formed at the one end side of the upper face as the main face of the substrate 81. The connection members 831 are respectively connected to three of the member connecting electrodes 811 on the outer row and the connection members 833 are respectively connected to two of the member connecting electrodes 813 on the inner row. The height of the connection members 833 is determined so as not to cause interference between parallel portions of the connection members 831 and the connection members 833 in the vertical direction. As illustrated in FIG. 19, viewing the mount assembly 8 from the one end side of the substrate 81, the connection members 831, 833 are adjacently arranged so that the height of the parallel portions from the main face of the substrate 81 is alternately to be high and to be low. Here, not limited to the combination of the connection members 831 and the connection members 833 as illustrated in FIG. 17, the connection members described in the first to fourth embodiments can be utilized as being appropriately combined for the combination of connection members respectively having different height of each parallel portion from the main face of the substrate 81.

Figure 20:
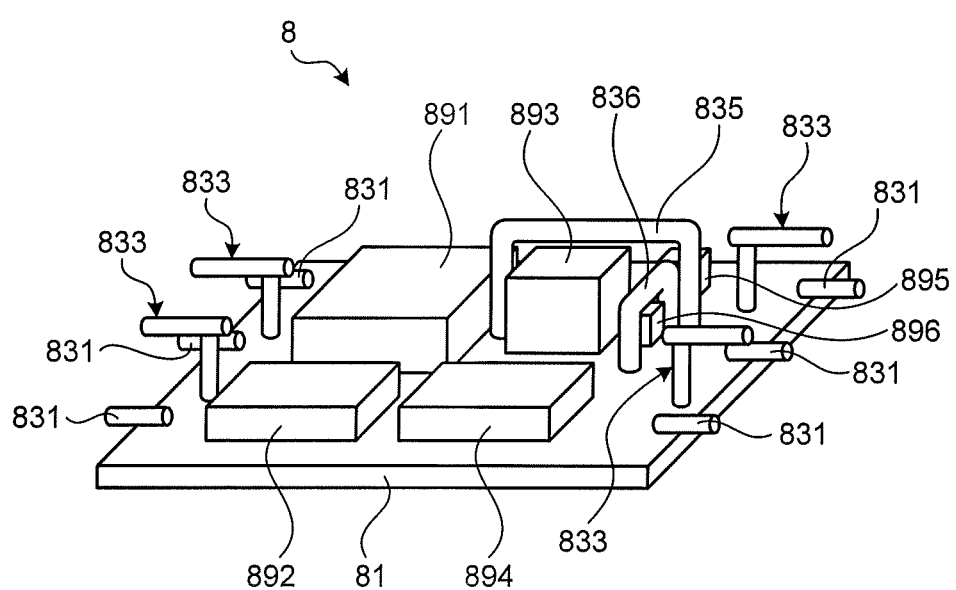
FIG. 20 is an explanatory schematic perspective view which illustrates the entire configuration of the mount assembly of the sixth embodiment.
Figure 21:
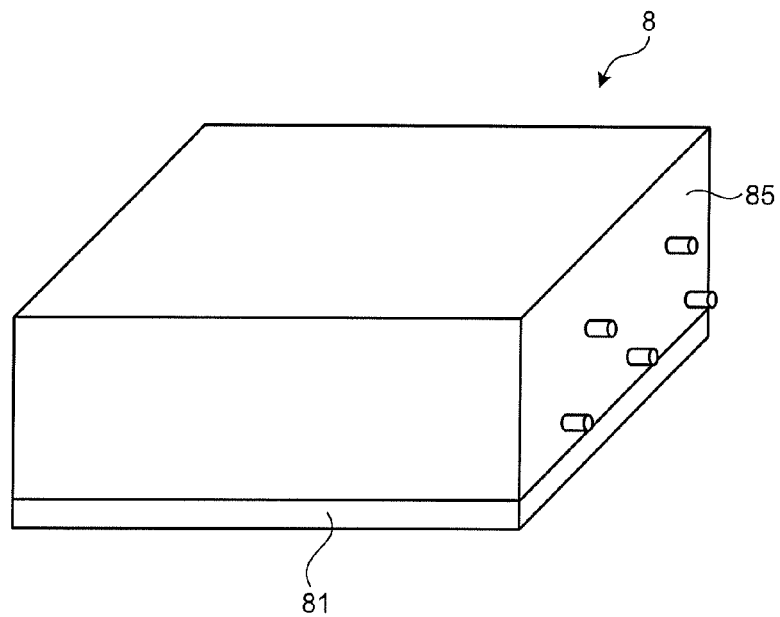
FIG. 21 is an explanatory schematic perspective view which illustrates the entire configuration of the mount assembly of the sixth embodiment.

FIGS. 20 and 21 are schematic perspective views illustrating the entire configuration of the mount assembly 8 of the sixth embodiment. FIG. 20 illustrates an example of the inner configuration of the mount assembly 8. As illustrated in FIG. 20, a plurality (i.e., six in the example of FIG. 20) of mount components 891 to 896 are mounted on the substrate 81 of the mount assembly 8. As described with reference to FIGS. 17 to 19, two types of the connection members 831 and the connection members 833 (i.e., three of the connection members 831 and two of the connection members 833) are arranged at the one end of the substrate 81 and are connected respectively to the member connecting electrodes (not illustrated) on the substrate 81. Similarly, two types of the connection members 831 and the connection members 833 (i.e., three of the connection members 831 and two of the connection members 833) are also arranged at the other end of the substrate 81 and are connected respectively to the member connecting electrodes (not illustrated) on the substrate 81. Further, U-shaped inter-electrode connection members 835, 836 respectively having different height are arranged on the substrate 81. Specifically, the respective inter-electrode connection members 835, 836 are arranged so that the parts formed to be parallel to the main face of the substrate 81 are sterically intersected above the mount components 893, 896. Then, the inter-electrode connection members 835, 836 connect the electrodes (not illustrated) as the connecting target formed on the substrate 81. As illustrated in FIG. 21, the mount assembly 8 is sealed with a resin 85 in order to fix and protect inner members such as the mount components 891 to 896 and the connection members 831, 833 and is modularized by performing polishing and the like on end faces thereof. Here, not limited to the short side of the substrate 81, it is also possible to form member connecting electrodes at an end of the long side and to connect other members such as a substrate at the outside thereof.

As described above, according to the mount assembly 8 of the sixth embodiment, it is possible to arrange the parallel portions of the adjacent connection members 831, 833 with a small pitch so that the mount assembly 8 can be miniaturized while obtaining similar effects to those of the abovementioned embodiments. Further, as described with reference to FIG. 17, the electrodes on the substrate 81 can be sterically connected by utilizing appropriate combination of the connection members 831, 833 respectively having different height of the portion arranged to be parallel to the main face of the substrate 81. With this configuration, the space above the substrate 81 can be effectively utilized and miniaturization can be achieved. In addition, compared to a case of connecting by forming a wiring pattern on a substrate, reliable connection can be actualized at low resistance.

Here, in the abovementioned first to sixth embodiments, the other end of the parallel portion formed at the connection member is extended to the outside of the one end of the upper face of the substrate constituting the mount assembly. However, the other end of the parallel portion is only required to be extended at least to the one end edge of the upper face of the substrate. In this case, an end face of a protection layer at one end side of the substrate is polished after forming the protection layer by filling resin onto the substrate, for example. In this manner, the other end face of the parallel portion may be exposed from a side face at the one end side of the mount assembly.

Figure 22:
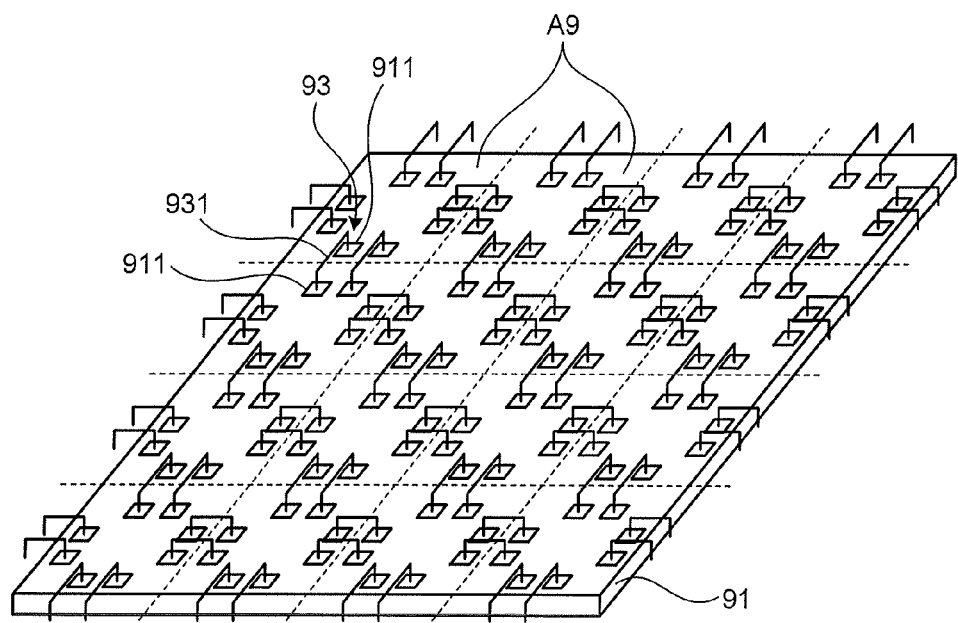
FIG. 22 is an explanatory view which illustrates a principle of a method for mount assembly manufacturing of a seventh embodiment.
Figure 23:
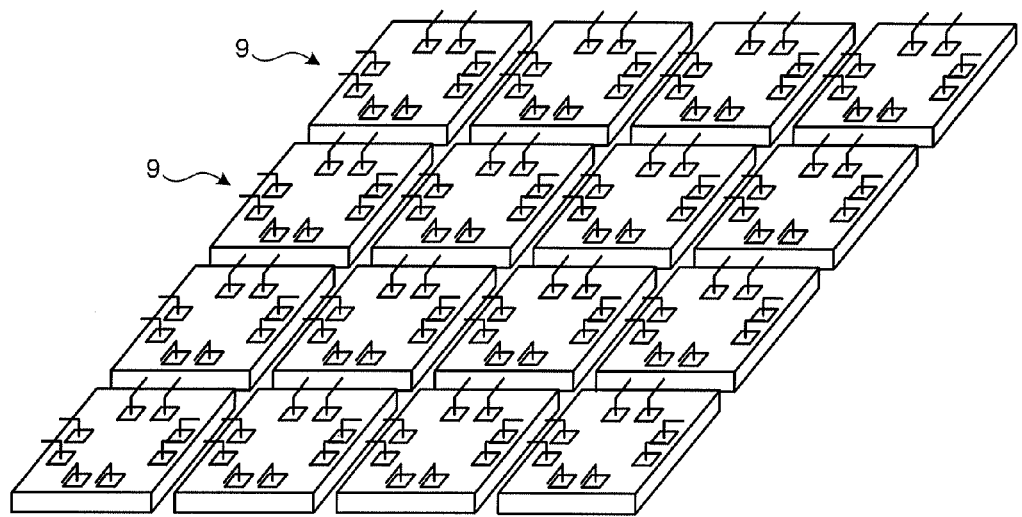
FIG. 23 is an explanatory view which illustrates the principle of the method for mount assembly manufacturing of the seventh embodiment.
Figure 24:
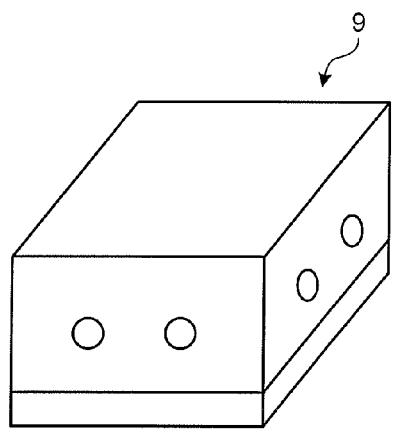
FIG. 24 is a schematic perspective view of a mount assembly manufactured by the method for mount assembly manufacturing of the seventh embodiment.

By the way, in the description of the above-mentioned embodiments, the mount assembly is produced (i.e., manufactured) as a single body. However, a method for manufacturing a mount assembly is not limited to this. The seventh embodiment relates to a method for manufacturing a mount assembly. FIGS. 22 and 23 are explanatory views illustrating a principle of the method for mount assembly manufacturing of the seventh embodiment. FIG. 24 is a schematic perspective view of a mount assembly 9 manufactured by the method for mount assembly manufacturing of the seventh embodiment.

In the present method for manufacturing, the plurality of mount assemblies 9 are simultaneously produced on a single substrate 91. On the main face as the upper face of the substrate 91, mount components (not illustrated) are mounted on each section area A9 defined by cutting positions as illustrated by dashed lines in FIG. 22. Then, the plurality of mount assemblies 9 are separated (i.e., individuated) by being cut at the cutting positions for the last time. In the present method for mount assembly manufacturing, member connecting electrodes 911, 911 are formed on the main face of the substrate 91 sandwiching the cutting position as being opposed to each other. In the example of FIG. 22, two couples of opposed member connecting electrodes 911, 911 are formed respectively at an end of each section area A9 as sandwiching each side. Then, as illustrated in FIG. 22, a member 93 having a pillar-shaped portion 931 to be a connection member when individuated into respective mount assemblies 9 as illustrated in FIG. 23 is placed between the opposed member connecting electrodes 911, 911. The pillar-shaped portion 931 forms a parallel portion of the connection member and the member 93 is arranged so that the pillar-shaped portion 931 passes over the cutting position. Then, after performing a protection layer arranging process and the like, the modularized mount assembly 9 can be obtained as illustrated in FIG. 24 by being individuated by being cut at the cutting positions for the last time.

Figure 25A:
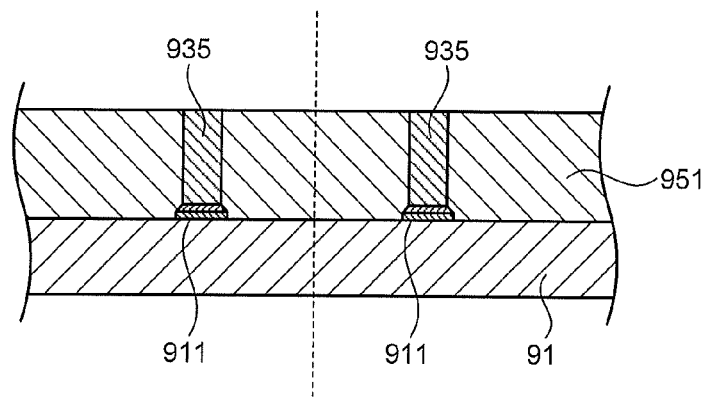
FIG. 25A is an explanatory view which illustrates a specific example of a process of the method for mount assembly manufacturing.
Figure 25B:
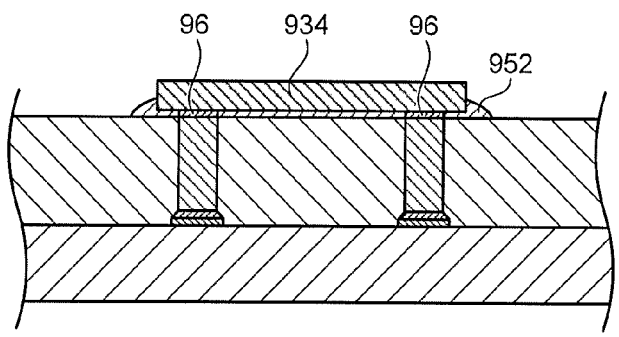
FIG. 25B is an explanatory view which illustrates a specific example of a process subsequent to FIG. 25A.
Figure 25C:
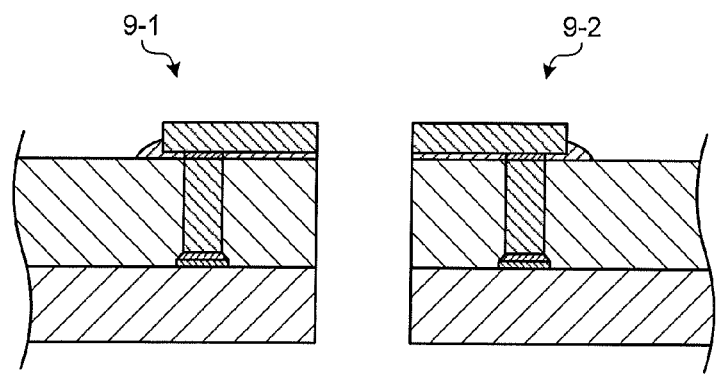
FIG. 25C is an explanatory view which illustrates a specific example of a process subsequent to FIG. 25B.
Figure 26:
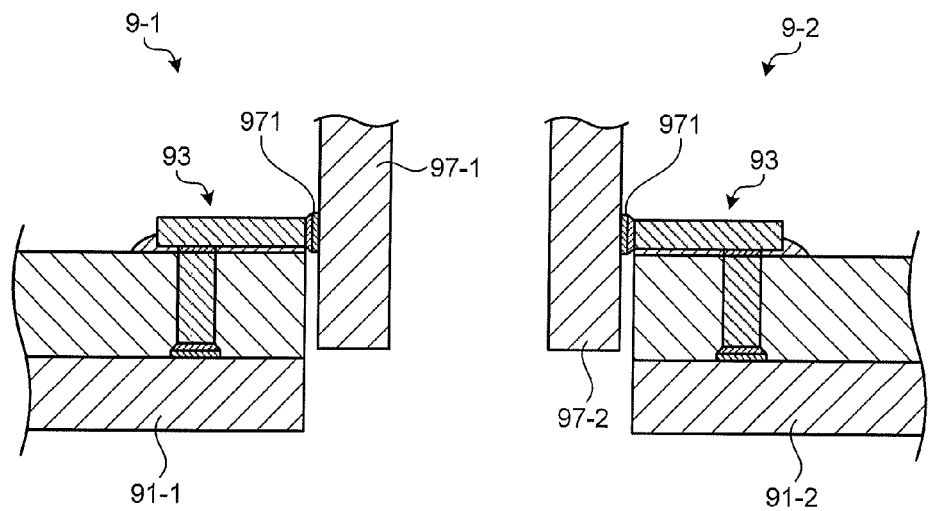
FIG. 26 is a partial sectional view which illustrates a state that a substrate is connected to the mount assembly manufactured by the method for manufacturing of FIGS. 25A to 25C.

FIGS. 25A to 25C are explanatory views illustrating a specific example of respective processes in the present method for mount assembly manufacturing. FIG. 26 is a partial sectional view illustrating a state that substrates 97-1, 97-2 as other members are connected to the manufactured mount assemblies 9 (9-1, 9-2). Following description is performed having a case to obtain a mount assembly to which the connection member 333 of the second embodiment is applied as an example. In this description, mount components (not illustrated) are previously mounted on the main face of the substrate 91. As illustrated in FIG. 25A, the member connecting electrodes 911, 911 are formed at the positions being opposed to each other sandwiching the cutting position indicated by a dashed line in FIG. 25A on the main face of the substrate 91 (i.e., an electrode forming process). Next, proceeding to a connecting process, one end face of each second pillar-shaped member 935 is connected to each member connecting electrode 911 as a support portion by soldering and the like as being vertically arranged thereon. Then, after forming a protection layer 951 by filling resin onto the substrate 91, the upper face of the protection layer 951 is polished to be planarized, so that the other end faces of the second pillar-shaped members 935, 935 are exposed. Subsequently, as illustrated in FIG. 25B, metallic films 96, 96 are formed at the other end faces of the exposed second pillar-shaped members 935, 935. Then, a single pillar-shaped member 934 corresponding to the pillar-shaped portion 931 is arranged to be parallel to the main face of the substrate 91, so that side faces of both ends are connected respectively to the other end faces of the second pillar-shaped members 935, 935 via the metallic films 96, 96. Next, proceeding to an arranging process, the vicinity of the connecting part between the pillar-shaped member 934 and the metallic films 96, 96 is sealed with a resin 952 and is fixed and protected. Then, proceeding to an individuating process, the mount assemblies 9 (9-1, 9-2) are obtained by individuating with dicing, as illustrated in FIG. 25C.

The mount assemblies 9-1, 9-2 manufactured as described above are connected to the substrates 97-1, 97-2 as other members respectively having a mount assembly connecting electrode 971 formed on a main face being similar to the abovementioned embodiments. Specifically, the substrate 97-1 is arranged so that the left side face in FIG. 26 as the main face is directed to a substrate 91-1 side and the main face thereof is perpendicular to the main face of the substrate 91-1 at the outside of one end of the substrate 91-1. Then, the mount assembly connecting electrode 971 of the substrate 97-1 is connected to the other end face of the connection member 93 extended to the outside of the one end of the substrate 91-1, so that the mount assembly 9-1 and the substrate 97-1 are mechanically and electrically connected. Similarly, the substrate 97-2 is arranged so that the right side face in FIG. 26 as a main face is directed to a substrate 91-2 side and the main face thereof is perpendicular to the main face of the substrate 91-2 at the outside of the one end of the substrate 91-2. Then, the mount assembly connecting electrode 971 of the substrate 97-2 is connected to the other end face of the connection member 93 extended to the outside of the one end of the substrate 91-2, so that the mount assembly 9-2 and the substrate 97-2 are mechanically and electrically connected.

As described above, according to the method for mount assembly manufacturing of the seventh embodiment, cost for manufacturing can be reduced and productivity can be improved since a plurality of mount assemblies can be produced at one time.

In the description of the seventh embodiment, the connection member having the configuration of the second embodiment is adopted. However, the connection members of other configurations described in the first, third and forth embodiments can be also adopted similarly. For example, in the case that the connection member having the configuration described in the fourth embodiment is adopted, an externally U-shaped member having support portions integrally formed at both ends of a pillar-shaped portion which forms a parallel portion is prepared. In the connecting process, proximal ends of the respective support portions which are vertically arranged are connected onto the respective member connecting electrodes being opposed as sandwiching the cutting position while the pillar-shaped portion is arranged to be parallel to the main face of the substrate. With this configuration, the number of processes for manufacturing can be reduced since the process to connect the second pillar-shaped members 935, 935 and the pillar-shaped member 934 described in the seventh embodiment is unnecessary.

Figure 27:
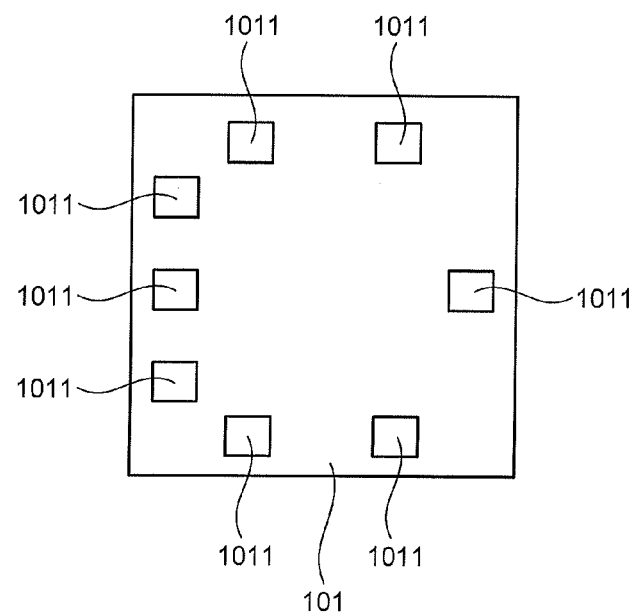
FIG. 27 is a view which illustrates a modified example of position arrangement of member connecting electrodes formed on a substrate.
Figure 28:
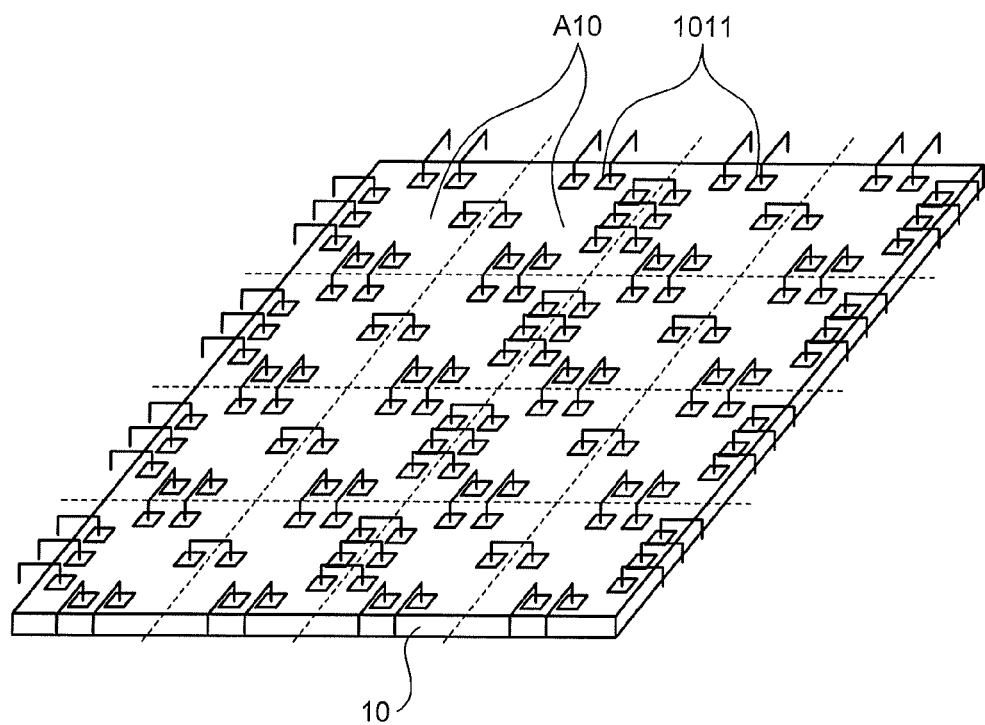
FIG. 28 is an explanatory view which illustrates a principle of a method for mount assembly manufacturing of the modified example.

Further, in the above description of the seventh embodiment, the member connecting electrodes are formed in the same number (i.e., two) at each end on the substrate constituting the mount assembly. However, the number of the member connecting electrodes formed at each end can be appropriately set. FIG. 27 is a view illustrating a modified example of position arrangement of member connecting electrodes 1011 formed on a substrate 101. FIG. 28 is an explanatory view illustrating a principle of a method for mount assembly manufacturing of the present modified example.

As illustrated in FIG. 27, on a main face of the mount assembly manufactured by the method for manufacturing of the present modified example, three of member connecting electrodes 1011 are formed at the left end of the substrate 101 in FIG. 27 and one member connecting electrode 1011 is formed at the right end. In addition, two member connecting electrodes 1011 are formed respectively at the upper end and lower end. In the connecting process of this case, as illustrated in FIG. 28, the respective member connecting electrodes 1011 are formed at the substrate 10 so that positions of the member connecting electrodes 1011 formed at adjacent section areas A10 are to be mutually axisymmetric sandwiching a cutting position indicated by a dashed line in FIG. 28. With this configuration, simultaneous producing can be performed even in the case that the number (including zero) of the member connecting electrodes to be formed at the end of the substrate differs for each end. More specifically, the simultaneous producing can be performed even in the case that the number of the member connecting electrodes formed at one opposed end is not the same, as long as the number of the member connecting electrodes formed at the other opposed end is the same.

Figure 29:
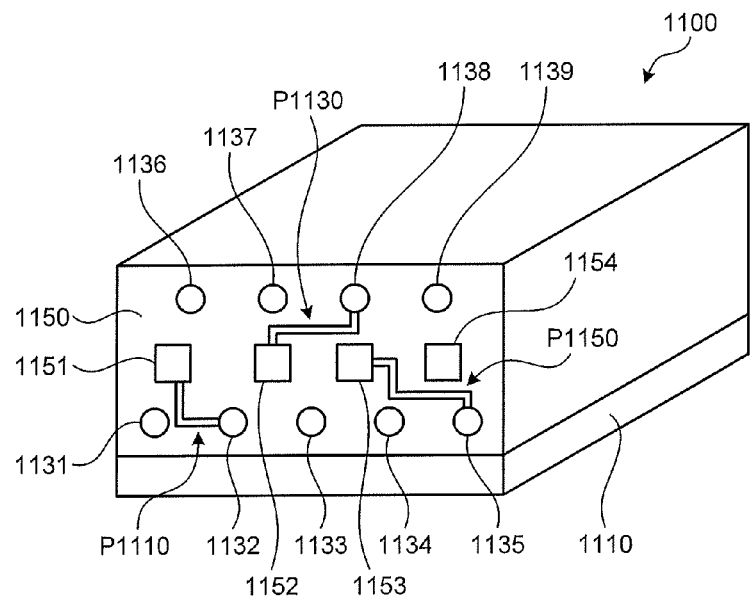
FIG. 29 is a schematic perspective view which illustrates the entire configuration of a mount assembly of an eighth embodiment.

FIG. 29 is a schematic perspective view illustrating the entire configuration of a mount assembly 1100 of the eighth embodiment. In the mount assembly 1100 of FIG. 29, a plurality (i.e. nine in the example of FIG. 29) of other ends of connection members 1131 to 1139 (specifically, other ends of parallel portions formed at the connection members 1131 to 1139) are exposed at an end face of a protection layer 1150 on a substrate 1110. Then, a plurality (i.e., four in the example of FIG. 29) of side face connecting electrodes 1151 to 1154 are formed at the end face, so that the side face connecting electrodes 1151 to 1154 are connected to other members respectively having a mount assembly connecting electrode formed on a main face thereof. Specifically, the other end of the connection member 1132 and the side face connecting electrode 1151 are connected via a wiring pattern P1110. The other end of the connection member 1138 and the side face connecting electrode 1152 are connected via a wiring pattern P1130. The other end of the connection member 1135 and the side face connecting electrode 1153 are connected via a wiring pattern P1150. Here, the wiring patterns P1110, P1130, P1150 are formed at the end face of the protection layer 1150. The wiring patterns P1110, P1130, P1150 can be formed by appropriately utilizing a thin-film method, an ink-jet method and the like, for example. At that time, it is also possible to form an insulating protection film at a part of the end face of the protection layer 1150 other than the side face connecting electrodes 1151 to 1154.

According to the eighth embodiment, since the side face connecting electrodes 1151 to 1154 to be connected to other members can be formed at the end face of the protection layer 1150, connecting positions in the mount assembly 1100 with other members can be flexibly adjusted and design flexibility can be increased.

Figure 30:
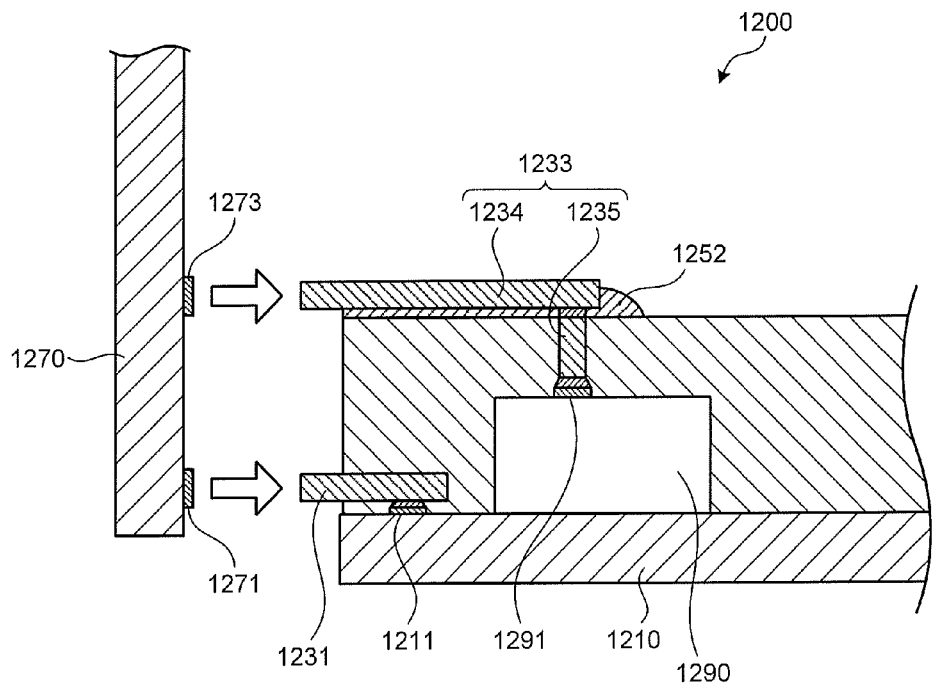
FIG. 30 is a view which illustrates a modified example of the mount assembly.

In the above description of the first to eighth embodiments, the member connecting electrode formed on the substrate constituting the mount assembly and the mount assembly connecting electrode formed on the substrate as another member are connected. However, the present invention is not limited to this. FIG. 30 is a view illustrating an example of a modified example of a mount assembly 1200. FIG. 30 illustrates a scene to connect a substrate 1270 as another member to the mount assembly 1200. As illustrated in FIG. 30, the mount assembly 1200 of the present modified example includes a substrate 1210 and two types of connection members 1231, 1233. A mount component 1290 is mounted on the upper face as a main face of the substrate 1210, and then, a member connecting electrode 1211 is formed at a predetermined position at one end side of the upper face while avoiding the mount component 1290.

The connection member 1231 is constituted similarly to the connection member 13 of the first embodiment. Meanwhile, the connection member 1233 is constituted similarly to the connection member 333 of the second embodiment. In the present modified example, one end face of a second pillar-shaped member 1235 of the connection member 1233 is connected to a member connecting electrode 1291 formed on a main face of the mount component 1290. Then, a first pillar-shaped member 1234 is arranged so that the longitudinal direction thereof is parallel to the main face of the substrate 1210 (i.e., parallel to the main face of the mount component 1290) and the other end thereof is extended to the outside of the one end of the substrate 1210. The vicinity of the connecting part between the first pillar-shaped member 1234 and the second pillar-shaped member 1235 is fixed and protected by being sealed with a resin 1252. The mount assembly 1200 is connected to the substrate 1270 as another member having mount assembly connecting electrodes 1271, 1273 formed on the main face thereof being similar to the abovementioned embodiments. Here, the length of the second pillar-shaped member 1235 of the connection member 1233 is determined in accordance with the position of the mount assembly connecting electrode 1273 of the substrate 1270 connected to the member connecting electrode 1291 by the connection member 1233 (i.e., in accordance with the height of the mount assembly connecting electrode 1273 of the substrate 1270 against the main face position of the mount component 1290 where the member connecting electrode 1291 is formed).

In the above description of the first to sixth embodiments, the other end face of the parallel portion formed at the connection member is connected to the mount assembly connecting electrode formed at another member such as the substrate. However, the present invention is not limited to this. In the following, a modified example will be described having a connection member of a similar configuration to the connection member of the fourth embodiment as an example. Here, the connection members of the other configurations described in the first to third embodiments may be similarly adopted.

Figure 31:
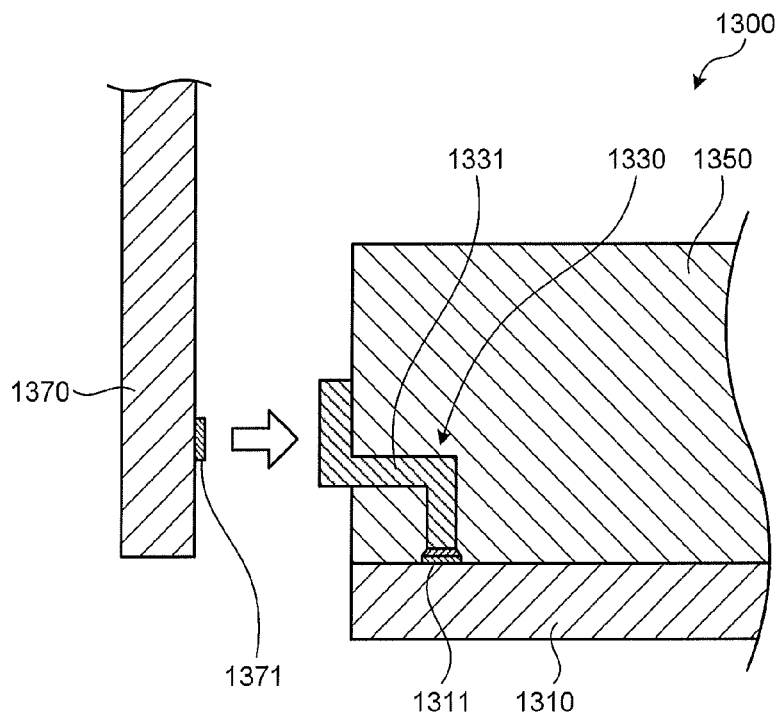
FIG. 31 is an explanatory view which illustrates a modified example of the method for connecting the other end side of a parallel portion formed on a connection member and a mount assembly connecting electrode.

FIG. 31 is an explanatory view of the modified example of a connection method between the other end side of a parallel portion 1331 formed at a connection member 1330 and a mount assembly connecting electrode 1371 of a substrate 1370 as another member. In the example of FIG. 31, the proximal end of the connection member 1330 is connected to a member connecting electrode 1311 and a protection layer 1350 is formed by filling resin onto a substrate 1310. Subsequently, a projection portion at the distal end side of the parallel portion 1331 of the connection member 1330 is folded upward, for example, along an end face of the protection layer 1350. A mount assembly 1300 is connected to the substrate 1370 as another member where the mount assembly connecting electrode 1371 is formed. Specifically, a side face of the other end of the folded parallel portion 1331 is connected to the mount assembly connecting electrode 1371. With this configuration, compared to a case of connecting the other end face of the parallel portion 1331 to the mount assembly connecting electrode 1371, the connection area of the parallel portion 1331 against the mount assembly connecting electrode 1371 can be widely ensured, so that the connection strength therebetween can be enhanced.

Figure 32:
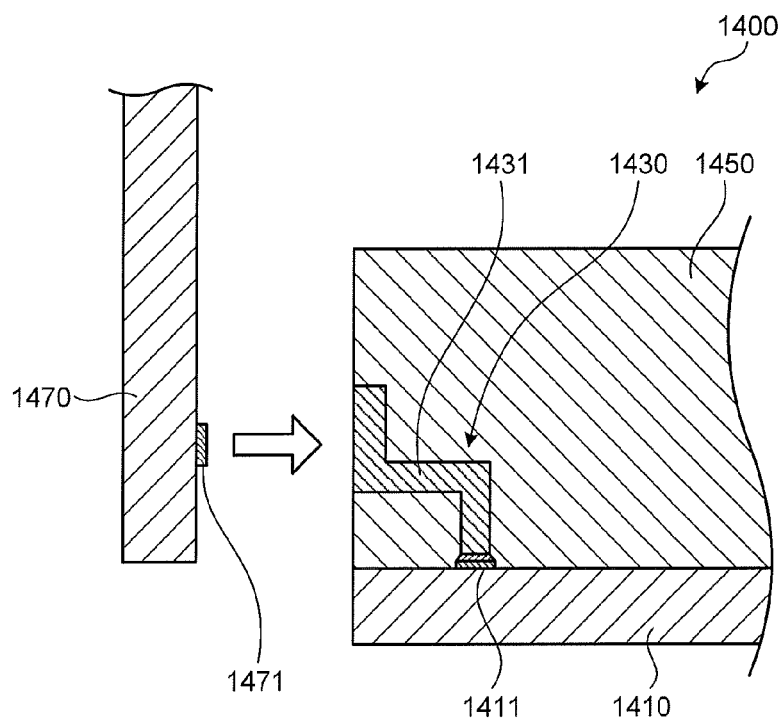
FIG. 32 is an explanatory view which illustrates another modified example of the method for connecting the other end side of a parallel portion formed on a connection member and a mount assembly connecting electrode.

FIG. 32 is an explanatory view of another modified example of a connection method of the other end side of a parallel portion 1431 formed at a connection member 1430 and a mount assembly connecting electrode 1471 of a substrate 1470 as another member. In the example of FIG. 32, the other end side of the parallel portion 1431 is folded upward, for example, after the proximal end of the connection member 1430 is connected to a member connecting electrode 1411. Subsequently, a protection layer 1450 is formed by filling resin onto a substrate 1410 and a side face of the other end of the parallel portion 1431 is exposed by polishing an end face of the protection layer 1450 at one end side of the substrate 1410. A mount assembly 1400 is connected to the substrate 1470 as another member where the mount assembly connecting electrode 1471 is formed. Specifically, the side face of the other end of the exposed parallel portion 1431 is connected to the mount assembly connecting electrode 1471. Similarly in this case, the connection area of the parallel portion 1431 against the mount assembly connecting electrode 1471 can be widely ensured, so that the connection strength therebetween can be enhanced.

Here, the substrate described as an example of a member constituting a mount assembly or another member may be an interconnection substrate having a wiring pattern formed or may be a substrate where an electronic circuit and the like are mounted inside.

In the description of the abovementioned embodiments, the substrate is connected to the mount assembly. However, another member to be the connection target is not limited to a substrate. For example, the present invention can be applied to a case that a member such as an electronic component and an electronic circuit module is arranged so that a main face thereof is perpendicular to a main face of a substrate and is connected thereto.

Figure 33:
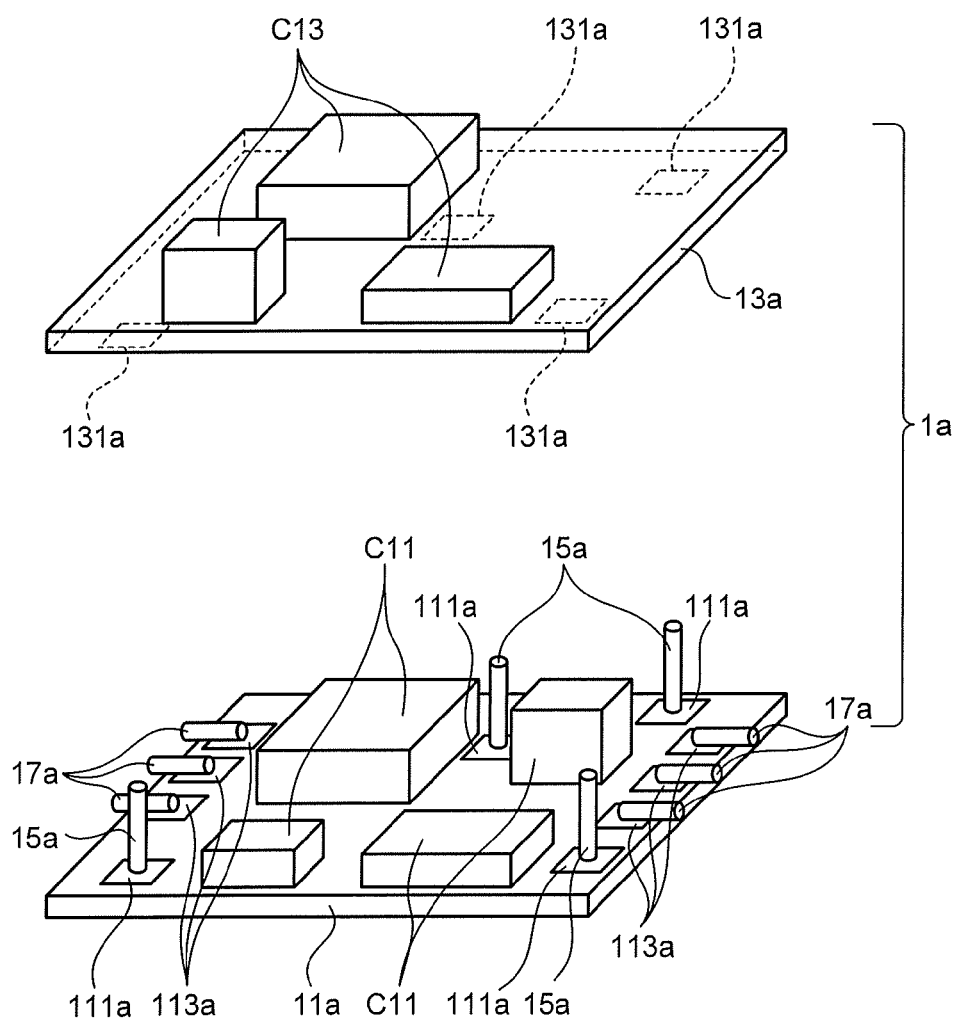
FIG. 33 is a perspective view which illustrates a configuration example of a mount assembly of a ninth embodiment.
Figure 34:
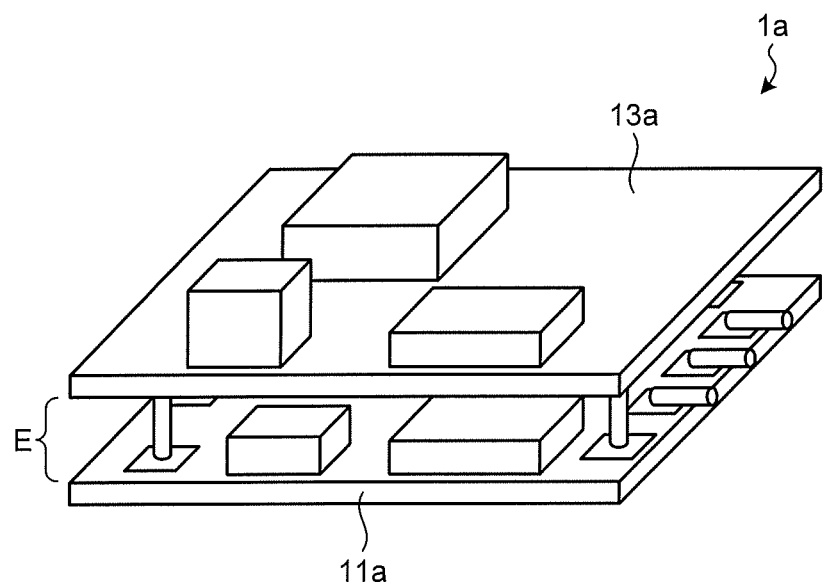
FIG. 34 is a perspective view which illustrates the configuration example of the mount assembly of the ninth embodiment.

FIGS. 33 and 34 are perspective views illustrating a configuration example of a mount assembly 1a of the ninth embodiment. In FIG. 33, a first substrate 11a and a second substrate 13a constituting the mount assembly 1a are illustrated as being separated. In FIG. 34, the first substrate 11a and the second substrate 13a are illustrated in a connected state. The mount assembly 1a in FIG. 33 includes the first substrate 11a and the second substrate 13a which are arranged to be opposed as main faces thereof being mutually parallel, an inter-substrate connection member 15a which mechanically and electrically connects the first substrate 11a and the second substrate 13a, and an inter-member connection member 17a which connects another member arranged at a side of the mount assembly 1a.

At the first substrate 11a of the lower side, mount components C11 as electronic components such as electronic circuits are mounted on the upper face as a main face. In addition, at the first substrate 11a, a plurality (i.e., four in the example of FIG. 33) of substrate connecting electrodes 111a are formed at predetermined positions of the upper face avoiding the mount components C11 and a plurality (i.e., three each at each short side in the example of FIG. 33) of member connecting electrodes 113a are formed at predetermined positions of short side ends. Meanwhile, at the second substrate 13a of the upper side, mount components C13 as electronic components such as electronic circuits are mounted on the upper face and substrate connecting electrodes 131a are formed on the lower face. The substrate connecting electrodes 131a are formed respectively at the positions which are to be opposed to the substrate connecting electrodes 111a of the first substrate 11a when the first substrate 11a and the second substrate 13a are arranged to be opposed.

The inter-substrate connection member 15a is a pillar-shaped member formed of conductive material. The inter-substrate connection member 15a connects the first substrate 11a and the second substrate 13a as one end face being contacted to the substrate connecting electrode 111a of the first substrate 11a and the other end face being contacted to the substrate connecting electrode 131a of the second substrate 13a. The inter-substrate connection member 15a is formed to have length determined by the height from the main face of the first substrate 11a to the lower face of the second substrate 13a.

Figure 35:
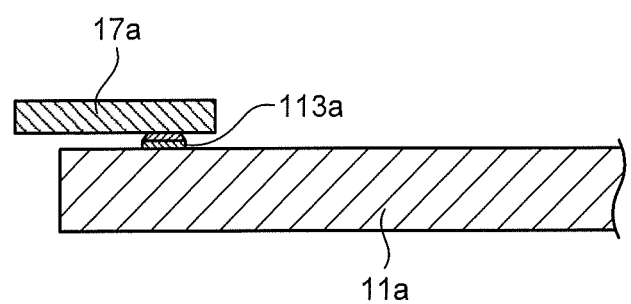
FIG. 35 is an explanatory view which illustrates a configuration example of an inter-member connection member of the ninth embodiment.

The inter-member connection member 17a is constituted with a single pillar-shaped member formed of conductive material. FIG. 35 is an explanatory view illustrating a configuration example of the inter-member connection member 17a. As illustrated in FIG. 35, the inter-member connection member 17a forms a parallel portion while being arranged so that the longitudinal direction thereof is parallel to the first substrate 11a as a side face of one end being contacted to the member connecting electrode 113a and the other end being extended to the outside of the one end of the upper face of the first substrate 11a. The inter-member connection member 17a is formed to have length determined by the distance from the member connecting electrode 113a to the one end of the first substrate 11a.

When manufacturing the mount assembly 1a, the inter-substrate connection member 15a is vertically arranged on the substrate connecting electrode 111a of the first substrate 11a having the mount component C11 mounted and is connected by soldering and the like thereto, for example. The inter-member connection member 17a is arranged so that the longitudinal direction thereof is parallel to the main face of the first substrate 11a and the other end is extended to the outside of the corresponding short side end of the first substrate 11a, and then, a side face of the one end of the inter-member connection member 17a is contacted and connected to the member connecting electrode 113a by soldering and the like. Subsequently, the first substrate 11a and the second substrate 13a are arranged to be mutually opposed. Then, the substrate connecting electrode 131a of the lower face is opposed to the substrate connecting electrode 111a of the first substrate 11a and the other end face of the inter-substrate connection member 15a is contacted and connected to the substrate connecting electrode 131a by soldering and the like. In this manner, the mount assembly 1a in which the first substrate 11a and the second substrate 13a are mechanically and electrically connected is obtained, as illustrated in FIG. 34. Then, a protection layer is formed by filling resin as a reinforcing member into a gap E between the first substrate 11a and the second substrate 13a, so that the inside members are fixed and protected. With this configuration, reliability of the mount assembly la can be improved and handling as a component can be eased. Here, it is also possible to form a protection layer by appropriately filling resin onto the second substrate 13a as well and to fix and protect the inside members such as mount components.

Figure 36:
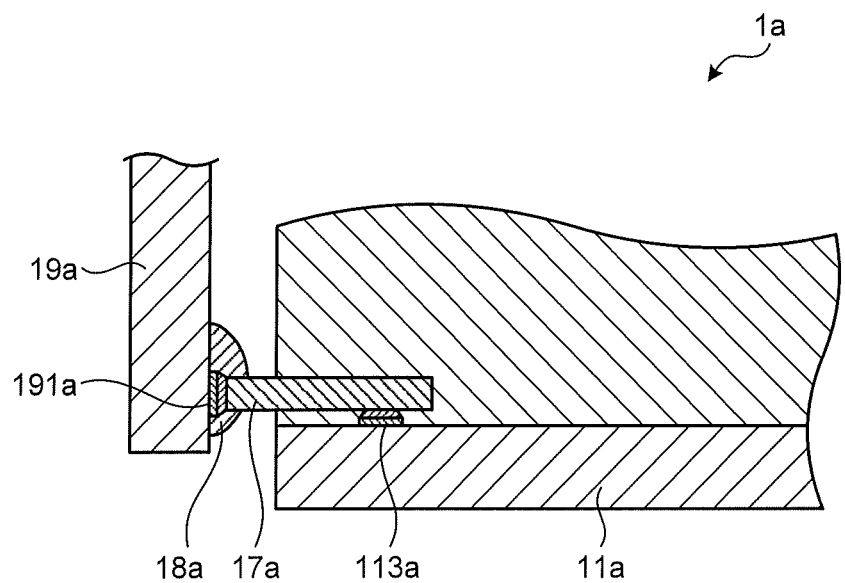
FIG. 36 is a partial sectional view of the vicinity of the inter-member connection member which illustrates a state that a substrate as another member is connected to the mount assembly.

FIG. 36 is a partial sectional view of the vicinity of the inter-member connection member 17a illustrating a state that a substrate 19a as another member is connected to the mount assembly 1a. The substrate 19a is arranged so that the right side face in FIG. 36 as a main face is directed to the first substrate 11a side and the main face thereof is perpendicular to the main face of the first substrate 11a at the outside of the one end of the first substrate 11a. Then, a mount assembly connecting electrode 191a is formed at a predetermined position of the right side face of the substrate 19a and is contacted and connected to the other end face of the inter-member connection member 17a extended to the outside of the one end of the first substrate 11a by soldering and the like. In this manner, the member connecting electrode 113a and the mount assembly connecting electrode 191a are connected, so that the mount assembly 1a and the substrate 19a are mechanically and electrically connected. Further, the vicinity of the connecting part between the mount assembly connecting electrode 191a and the inter-member connection member 17a is fixed and protected by being sealed with a resin 18a.

As described above, according to the mount assembly 1a of the ninth embodiment, it is possible to arrange the inter-member connection member 17a constituted with the single pillar-shaped member to be parallel to the main face of the first substrate 11a, while one end thereof is connected to the member connecting electrode 113a which is formed at the main face of the first substrate 11a and the other end is extended to the outside the one end of the upper face of the first substrate 11a. Then, the mount assembly 1a having the second substrate 13a laminated on the first substrate 11a can be actualized. Accordingly, other members such as the second substrate 13a arranged so that the main face thereof is perpendicular to the main face of the first substrate 11a can be connected to the other end of the inter-member connection member 17a (i.e., the parallel portion). With this configuration, other members such as a substrate can be easily connected to the mount assembly 1a in high density. In addition, the member connecting electrode 113a and the mount assembly connecting electrode 191a can be connected by the pillar-shaped inter-member connection member 17a. At that time, it is also possible that the diameter of the inter-member connection member 17a is appropriately enlarged in consideration of the space on the first substrate 11a. Accordingly, compared to a case of forming a wiring pattern on the first substrate for connection, reliable connection can be actualized at low resistance.

In the above description of the ninth embodiment, the inter-member connection member is constituted with a single pillar-shaped member. However, the configuration of the inter-member connection member is not limited to this.

Figure 37:
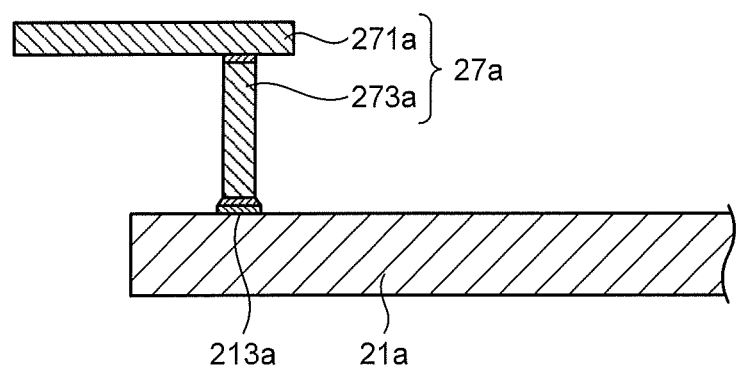
FIG. 37 is an explanatory view which illustrates a configuration example of an inter-member connection member of modified example 1.

FIG. 37 is an explanatory view illustrating a configuration example of an inter-member connection member 27a of modified example 1. The inter-member connection member 27a of modified example 1 includes a first pillar-shaped member 271a and a second pillar-shaped member 273a as a support portion. The respective pillar-shaped members 271a, 273a formed of conductive material form an approximately L-shaped external shape as one end face of the second pillar-shaped member 273a which supports the first pillar-shaped member 271a is connected to a side face of one end of the first pillar-shaped member 271a forming a parallel portion. The other end face of the second pillar-shaped member 273a of the inter-member connection member 27a is connected to a member connecting electrode 213a of a first substrate 21a. Then, the first pillar-shaped member 271a is arranged so that the longitudinal direction thereof is parallel to the main face of the first substrate 21a and the other end thereof is extended to the outside of the one end of the first substrate 21a. Here, the length of the second pillar-shaped member 273a is determined in accordance with the position of the mount assembly connecting electrode of the member to be connected to the member connecting electrode 213a by the inter-member connection member 27a (i.e., in accordance with the height of the mount assembly connecting electrode of another member against the main face position of the first substrate 21a).

When connecting the inter-member connection member 27a to the member connecting electrode 213a, first, the other end face of the second pillar-shaped member 273a is connected to the member connecting electrode 213a as being vertically arranged thereon. Subsequently, the first pillar-shaped member 271a is placed so that the longitudinal direction thereof is parallel to the main face of the first substrate 21a, and then, the side face of the one end thereof is contacted to the one end face of the second pillar-shaped member 273a and connected thereto via a metallic film. Here, it is also possible that the side face of the one end of the first pillar-shaped member 271a and the one end face of the second pillar-shaped member 273a are previously connected by soldering and the like.

Figure 38:
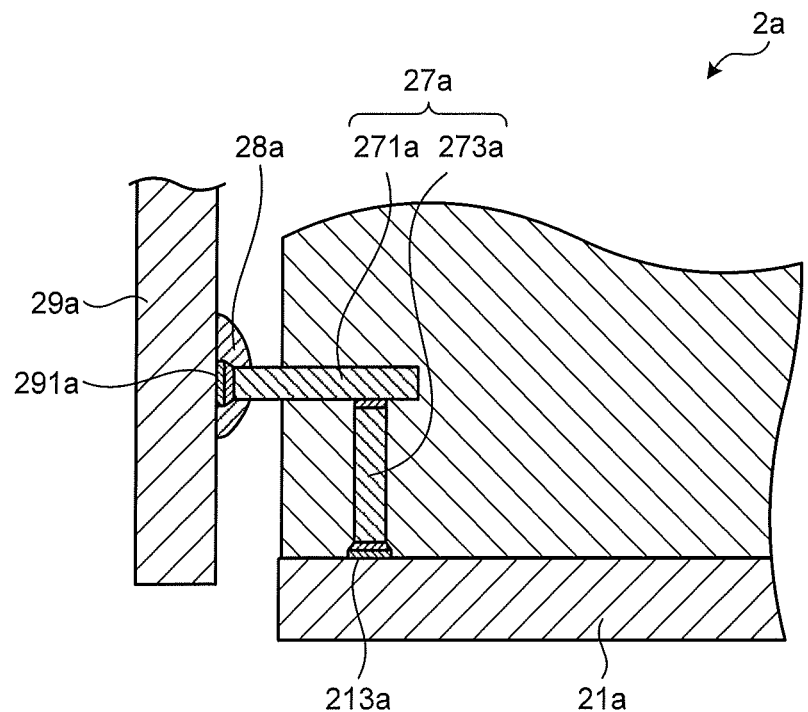
FIG. 38 is a partial sectional view of a mount assembly having the inter-member connection member of modified example 1.

FIG. 38 is a partial sectional view of a vicinity of the inter-member connection member 27a illustrating a state that a substrate 29a as another member is connected to a mount assembly 2a having the inter-member connection member 27a of modified example 1. The substrate 29a is arranged so that the right side face in FIG. 38 as a main face is directed to the first substrate 21a side and the main face thereof is perpendicular to the main face of the first substrate 21a at the outside of the one end of the first substrate 21a. Then, a mount assembly connecting electrode 291a is formed at a predetermined position of the right side face of the substrate 29a and is contacted and connected to the other end face of the inter-member connection member 27a extended to the outside of the one end of the first substrate 21a by soldering and the like. In this manner, the member connecting electrode 213a and the mount assembly connecting electrode 291a are connected, so that the mount assembly 2a and the substrate 29a are mechanically and electrically connected. Further, the vicinity of the connecting part between the mount assembly connecting electrode 291a and the inter-member connection member 27a is fixed and protected by being sealed with a resin 28a.

As described above, according to modified example 1, the inter-member connection member 27a having a predetermined height can be constituted by adjusting the length of the second pillar-shaped member 273a.

Figure 39:
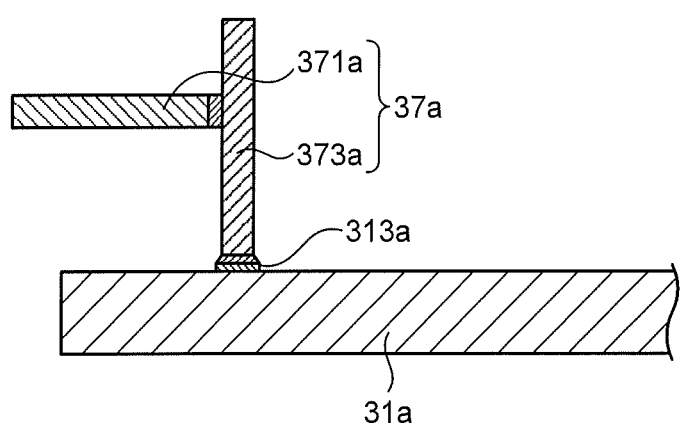
FIG. 39 is an explanatory view which illustrates a configuration example of an inter-member connection member of modified example 2.

FIG. 39 is an explanatory view of a configuration example of the inter-member connection member 37a of modified example 2. The inter-member connection member 37a of modified example 2 includes a first pillar-shaped member 371a and a second pillar-shaped member 373a as a support portion. The respective pillar-shaped members 371a, 373a are formed of conductive material. One end face of the first pillar-shaped member 371a is connected to a side face of the second pillar-shaped member 373a. One end face of the second pillar-shaped member 373a is contacted to a member connecting electrode 313a of a first substrate 31a. Then, the first pillar-shaped member 371a is arranged so that the longitudinal direction thereof is parallel to a main face of the first substrate 31a and the other end thereof is extended to the outside of the one end of the first substrate 31a. Here, the connecting position of the first pillar-shaped member 371a against the second pillar-shaped member 373a is determined in accordance with the position of the mount assembly connecting electrode of another member to be connected to the member connecting electrode 313a by the inter-member connection member 37a (i.e., in accordance with the height of the mount assembly connecting electrode of another member against the main face position of the first substrate 31a).

When connecting the inter-member connection member 37a to the member connecting electrode 313a, the one end face of the first pillar-shaped member 371a is previously connected to the side face of the second pillar-shaped member 373a via a metallic film, for example. Then, the first pillar-shaped member 371a is arranged so that the longitudinal direction thereof is parallel to the main face of the first substrate 31a and the other end thereof is extended to the outside of the one end of the first substrate 31a. The one end face of the second pillar-shaped member 373a is connected to the member connecting electrode 313a as being vertically arranged thereon.

Figure 40:
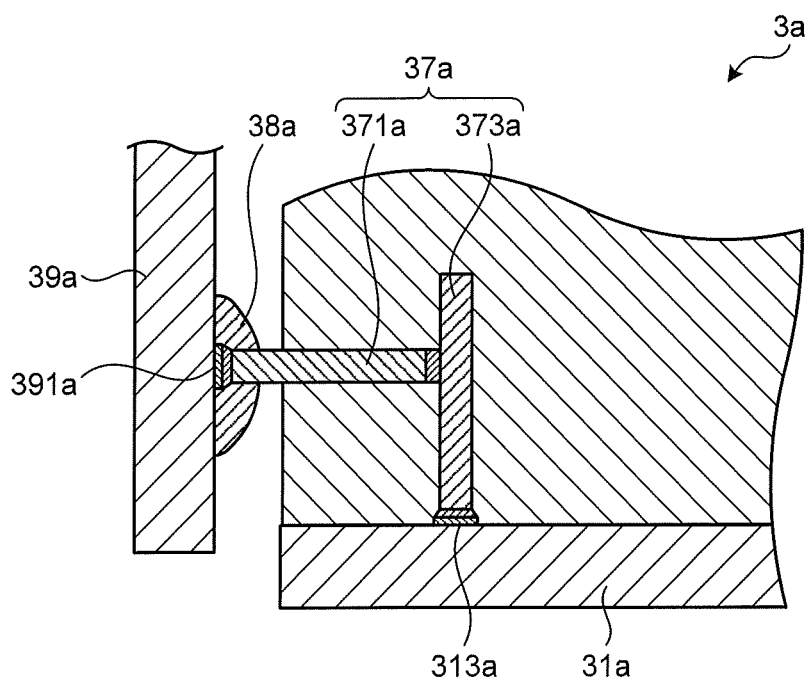
FIG. 40 is a partial sectional view of a mount assembly having the inter-member connection member of modified example 2.

FIG. 40 is a partial sectional view of the vicinity of an inter-member connection member 37a illustrating a state that a substrate 39a as another member is connected to a mount assembly 3a having the inter-member connection member 37a of modified example 2. The substrate 39a is arranged so that the right side face in FIG. 40 as a main face is directed to the first substrate 31a side and the main face thereof is perpendicular to the main face of the first substrate 31a at the outside of the one end of the first substrate 31a. Then, a mount assembly connecting electrode 391a is formed at a predetermined position of the right side face of the substrate 39a and is contacted and connected to the other end face of the inter-member connection member 37a extended to the outside of the one end of the first substrate 31a by soldering and the like. In this manner, the member connecting electrode 313a and the mount assembly connecting electrode 391a are connected, so that the mount assembly 3a and the substrate 39a are mechanically and electrically connected. Further, the vicinity of the connecting part between the mount assembly connecting electrode 391a and the inter-member connection member 37a is fixed and protected by being sealed with a resin 38a.

As described above, according to modified example 2, the height of the parallel portion (i.e., the first pillar-shaped member 371a) against the main face of the first substrate 31a can be adjusted by adjusting the connecting position of the first pillar-shaped member 371a against the second pillar-shaped member 373a. Accordingly, it is not necessary to form the second pillar-shaped member having different length for height adjustment unlike modified example 1, so that cost can be reduced.

Figure 41:
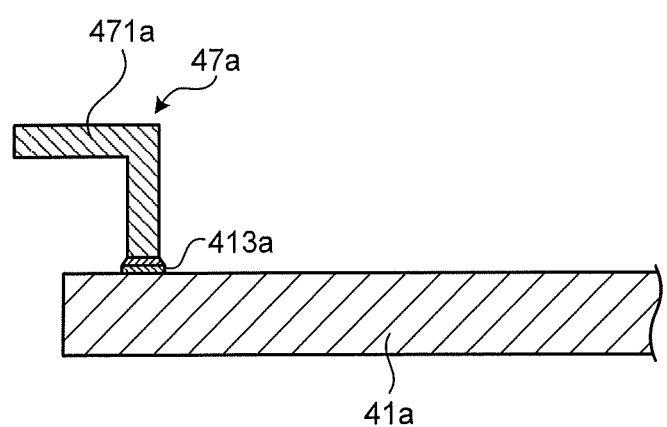
FIG. 41 is an explanatory view which illustrates a configuration example of an inter-member connection member of modified example 3.

FIG. 41 is an explanatory view of a configuration example of an inter-member connection member 47a of modified example 3. The inter-member connection member 47a of modified example 2 integrates the first and second pillar-shaped members constituting the inter-member connection member 27a of modified example 1 or the inter-member connection member 37a of modified example 2. In the example of FIG. 41, the inter-member connection member 47a has an L-shaped external shape which is obtained by bending a single pillar-shaped member formed of conductive material at a midpoint to form a parallel portion 471a. Then, the inter-member connection member 47a is arranged so that the proximal end thereof is contacted to a member connecting electrode 413a of a first substrate 41a, the parallel portion 471a is parallel to the main face of the first substrate 41a and the distal end thereof is extended to the outside of the one end of the first substrate 41a. Here, the length from the proximal end to the midpoint of the inter-member connection member 47a is determined in accordance with the position of a mount assembly connecting electrode of another member to be connected to the member connecting electrode 413a by the inter-member connection member 47a (i.e., in accordance with the height of the mount assembly connecting electrode of another member against the main face position of the first substrate 41a).

When connecting the inter-member connection member 47a to the member connecting electrode 413a, the parallel portion 471a of the inter-member connection member 47a is set to be parallel to the first substrate 41a. Then, the proximal end is connected onto the member connecting electrode 413a as being vertically arranged thereon so that the distal end of the parallel portion 471a is extended to the outside of the one end of the first substrate 41a.

Figure 42:
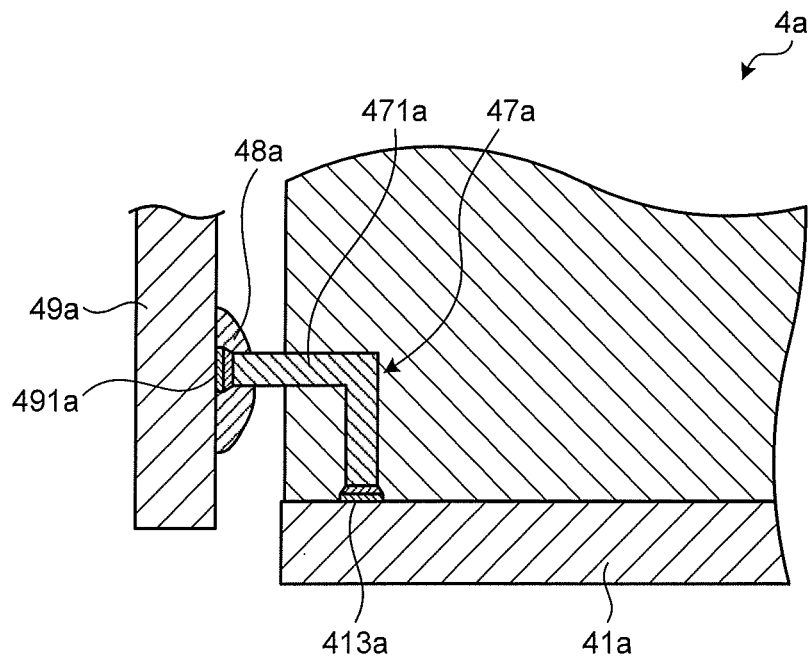
FIG. 42 is a partial sectional view of a mount assembly having the inter-member connection member of modified example 3.

FIG. 42 is a partial sectional view of the vicinity of the inter-member connection member 47a illustrating a state that a substrate 49a as another member is connected to a mount assembly 4a having the inter-member connection member 47a of modified example 3. The substrate 49a is arranged so that the right side face in FIG. 42 as a main face is directed to the first substrate 41a side and the main face thereof is perpendicular to the main face of the first substrate 41a at the outside of the one end of the first substrate 41a. Then, a mount assembly connecting electrode 491*a* is formed at a predetermined position of the right side face of the substrate 49*a* and is contacted and connected to the other end face of the inter-member connection member 47*a* extended to the outside of the one end of the first substrate 41*a* by soldering and the like. In this manner, the member connecting electrode 413*a* and the mount assembly connecting electrode 491*a* are connected, so that the mount assembly 4*a* and the substrate 49*a* are mechanically and electrically connected. Further, the vicinity of the connecting part between the mount assembly connecting electrode 491*a* and the inter-member connection member 47*a* is fixed and protected by being sealed with a resin 48*a*.

As described above, according to modified example 3, it is not necessary to connect the first and second pillar-shaped members which are formed separately unlike modified examples 1 and 2. Accordingly, the process to connect the first and second pillar-shaped members becomes unnecessary while the number of parts can be reduced. With this configuration, since the number of processes of manufacturing can be reduced, manufacturing the mount assembly 4*a* can be performed more easily.

Figure 43:
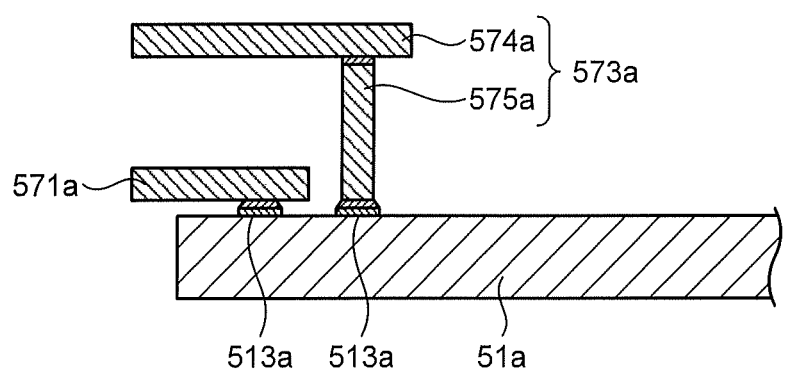
FIG. 43 is an explanatory view which illustrates a configuration of an inter-member connection member of modified example 4.

FIG. 43 is an explanatory view of the configuration of inter-member connection members 571*a*, 573*a* of modified example 4. In modified example 4, member connecting electrodes 513*a*, 513*a* are formed at predetermined positions at one end side of the upper face as a main face of a first substrate 51*a* and two types of the inter-member connection members 571*a*, 573*a* are connected respectively to the member connecting electrodes 513*a*, 513*a*.

The inter-member connection member 571*a* configured to be similar to the inter-member connection member 17*a* of the ninth embodiment is arranged to be contacted to the outer member connecting electrode 513*a* and is arranged so that the longitudinal direction thereof is parallel to the first substrate 51*a* and the other end is extended to the outside of one end of the first substrate 51*a*. Meanwhile, the inter-member connection member 573*a* configured to be similar to the inter-member connection member 27*a* of modified example 1 is constituted with a first pillar-shaped member 574*a* and a second pillar-shaped member 575*a*. One end face of the second pillar-shaped member 575*a* of the inter-member connection member 573*a* is connected to the inner member connecting electrode 513*a*. Then, the first pillar-shaped member 574*a* is arranged so that the longitudinal direction thereof is parallel to a main face of the first substrate 51*a* and the other end thereof is extended to the outside of the one end of the first substrate 51*a*. Here, the length of the second pillar-shaped member 575*a* is determined so as not to cause interference between parallel portions of the inter-member connection members 571*a*, 573*a* which are arranged one above the other (i.e., the inter-member connection member 571*a* and the first pillar-shaped member 574*a* of the inter-member connection member 573*a*) in accordance with the position of a mount assembly connecting electrode of another member to be connected to the member connecting electrode 513*a* by the inter-member connection member 573*a* (i.e., in accordance with the height of the mount assembly connecting electrode of another member against the main face position of the first substrate 51*a*).

When connecting the inter-member connection members 571*a*, 573*a* to the member connecting electrodes 513*a*, 513*a*, the inter-member connection member 571*a* is placed so that the longitudinal direction thereof is parallel to the main face of the first substrate 51*a*, and then, a side face of the one end of the inter-member connection member 571*a* is connected to the member connecting electrode 513*a*. Further, one end face of the second pillar-shaped member 575*a* constituting the inter-member connection member 573*a* is connected to the member connecting electrode 513*a* as being vertically arranged thereon. Subsequently, the first pillar-shaped member 574*a* is placed so that the longitudinal direction thereof is parallel to the main face of the first substrate 51*a*, and then, the side face of the one end thereof is contacted to the other end face of the second pillar-shaped member 575*a* and connected thereto via a metallic film.

Figure 44:
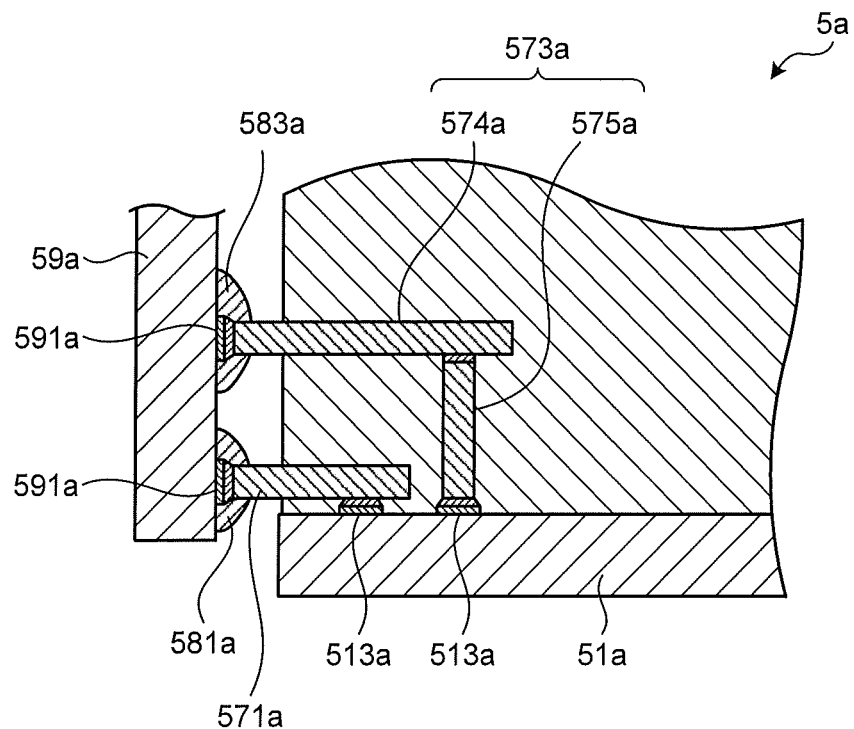
FIG. 44 is a partial sectional view of a mount assembly having the inter-member connection member of modified example 4.

FIG. 44 is a partial sectional view of the vicinity of the inter-member connection members 571*a*, 573*a* illustrating a state that a substrate 59*a* as another member is connected to a mount assembly 5*a* having the inter-member connection members 571*a*, 573*a* of modified example 4. The substrate 59*a* is arranged so that the right side face in FIG. 44 as a main face is directed to the first substrate 51*a* side and the main face thereof is perpendicular to the main face of the first substrate 51*a* at the outside of the one end of the first substrate 51*a*. Then, mount assembly connecting electrodes 591*a*, 591*a* are formed at predetermined positions of the right side face of the substrate 59*a* and are contacted and connected respectively to the other end face of the inter-member connection member 571*a* extended to the outside of the one end of the first substrate 51*a* and the other end face of the second pillar-shaped member 575*a* of the inter-member connection member 573*a* by soldering and the like. In this manner, the member connecting electrode 513*a* and the mount assembly connecting electrode 591*a* are connected while the member connecting electrode 513*a* and the mount assembly connecting electrode 591*a* are connected, so that the mount assembly 5*a* and the substrate 59*a* are mechanically and electrically connected. Further, the vicinity of the connecting part between the mount assembly connecting electrode 591*a* and the inter-member connection member 571*a* is sealed with a resin 581*a* and the vicinity of the connecting part between the mount assembly connecting electrode 591*a* and the inter-member connection member 573*a* is sealed with a resin 583*a*, so that the vicinities of the connecting parts are fixed and protected.

As described above, according to modified example 4, the connection can be achieved with overlapped arrangement of the parallel portions not to be mutually contacted by utilizing combination of the two types of the inter-member connection members 571*a*, 573*a*. Accordingly, since the space above the first substrate 51*a* may be effectively utilized, design flexibility is increased.

Here, not limited to the case of combining the inter-member connection members 571*a*, 573*a*, it is also possible to constitute connection members having different height of the parallel portion against the main face of the first substrate 51*a* by utilizing the second pillar-shaped member having different length and to utilize the combination thereof. Further, it is also possible to combine the connection members described in modified examples 2 and 3. For example, in the case that the inter-member connection members described in modified example 2 are combined, the connecting position of the first pillar-shaped member against the second pillar-shaped member is adjusted so as not to cause contact between respective parallel portions. Further, it is also possible that the inter-member connection members are configured respectively to have different height of the parallel portion against the main face of the first substrate by varying the connecting position of the first pillar-shaped member against the second pillar-shaped member and that the combination thereof is utilized. In the case that the inter-member connection members described in modified example 3 are combined, the length from the proximal end to the midpoint is adjusted so as not cause contact between respective parallel portions. Further, it is also possible that the inter-member connection members are configured respectively to have different height of the parallel portion against the main face of the first substrate 51a by varying the length from the proximal end to the midpoint and that the combination thereof is utilized.

Figure 45:
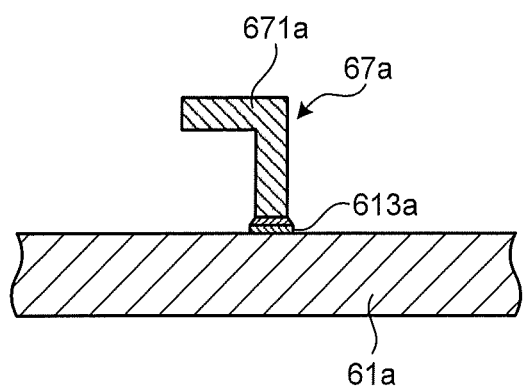
FIG. 45 is an explanatory view which illustrates the configuration of an inter-member connection member of a tenth embodiment.

In the description of the ninth embodiment, the other end of the connection member forming the parallel portion is extended to the outside of the one end of the first substrate. However, it is also possible that the other end of the parallel portion is located above the first substrate. FIG. 45 is an explanatory view of the configuration of an inter-member connection member 67a of the tenth embodiment. In the present embodiment, a member connecting electrode 613a is formed at a predetermined position of one end side of the upper face as a main face of a first substrate 61a. Then, the inter-member connection member 67a configured to be similar to the inter-member connection member 47a of modified example 3 is connected to the member connecting electrode 613a. Similar to modified example 3, the inter-member connection member 67a is arranged so that the proximal end thereof is contacted to the member connecting electrode 613a and the longitudinal direction of a parallel portion 671a is parallel to the first substrate 61a. However, in the tenth embodiment, the distal end of the parallel portion 671a is located above the first substrate 61a.

Figure 46:
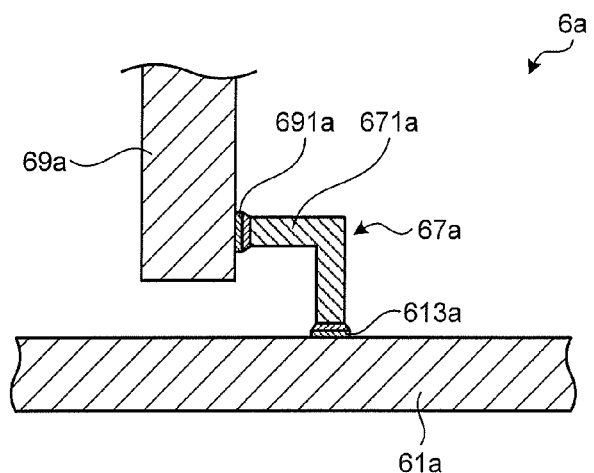
FIG. 46 is a partial sectional view which illustrates a state that a substrate is connected to a mount assembly of the tenth embodiment.

FIG. 46 is a partial sectional view illustrating a state that a substrate 69a as another member is connected to a mount assembly 6a. In FIG. 46, a protection layer formed by filling resin onto the first substrate 61a is not illustrated. The substrate 69a is arranged above the first substrate 61a so that a main face thereof is perpendicular to the main face of the first substrate 61a. Then, a mount assembly connecting electrode 691a is formed at a predetermined position of the right side face in FIG. 46 as the main face of the substrate 69a and is contacted and connected to the other end face of the parallel portion 671a of the inter-member connection member 67a located above the first substrate 61a by soldering and the like. In this manner, the member connecting electrode 613a and the mount assembly connecting electrode 691a are connected, so that the mount assembly 6a and the substrate 69a are mechanically and electrically connected.

As described above, according to the tenth embodiment, it is possible to connect the substrate 69a at the inside of the mount assembly 6a so that the main face thereof is arranged to be perpendicular to the main face of the first substrate 61a while obtaining similar effects to those of the ninth embodiment. Therefore, it is possible to actualize the mount assembly 6a having other members such as the substrate 69a connected thereto in higher density. Here, the above description is performed on the case that the connection member constituted as in modified example 3 is applied. However, the connection members having other configurations described in the ninth embodiment and modified examples 1 and 2 may be similarly applied.

Figure 47:
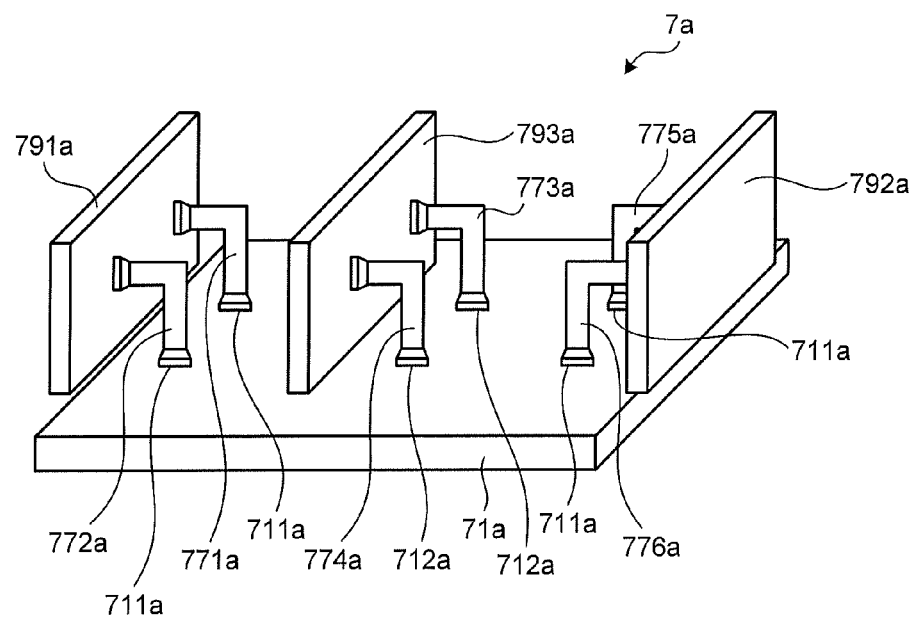
FIG. 47 is a schematic perspective view which schematically illustrates the entire configuration of an electronic circuit module including the mount assembly of the tenth embodiment.

FIG. 47 is a schematic perspective view which schematically illustrates the entire configuration of an electronic circuit module 7a including the mount assembly of the tenth embodiment. FIG. 47 skips to illustrate a second substrate arranged to be opposed to a first substrate 71a, an inter-substrate connection member connecting the second substrate to the first substrate 71a, and a protection layer formed by filling resin onto the first substrate 71a. The electronic circuit module 7a in FIG. 47 is provided with the first substrate 71a having a plurality of member connecting electrodes 711a formed at short side ends of the upper face as a main face (i.e., two each at both short side ends in the example of FIG. 47) and having a plurality of member connecting electrodes 712a (i.e., two in the example of FIG. 47) at predetermined positions at the center thereof and inter-member connection members 771a to 776a having the proximal end respectively connected to each member connecting electrode 711a, 712a. In this manner, the electronic circuit module 7a includes the mount assembly described in the tenth embodiment. Then, two substrates 791a, 792a are arranged at the outside of the respective short sides of the first substrate 71a so that main faces thereof are perpendicular to the main face of the first substrate 71a. The substrate 791a is connected by the inter-member connection members 771a, 772a and the substrate 792a is connected by the inter-member connection members 775a, 776a. In addition, one substrate 793a is arranged above the first substrate 71a so that a main face thereof is perpendicular to the main face of the first substrate 71a and is connected by the inter-member connection members 773a, 774a. Here, mount components (not illustrated), inter-substrate connection members (not illustrated) for connecting to the second substrate and the like are mounted on the first substrate 71a, and then, the substrate 793a is connected while avoiding the mount components. In this manner, according to the electronic circuit module 7a including the mount assembly of the tenth embodiment, other members such as the substrate 793a can be connected to the inside of the mount assembly (i.e., above the first substrate 71a) as well, so that the space above the first substrate 71a can be effectively utilized. Therefore, it is possible to configure the electronic circuit module 7a to mount the substrates 791a, 792a, 793a as other members against the mount assembly in higher density. Here, not limited to the short side of the first substrate 71a, it is also possible to form member connecting electrodes at an end of the long side and to connect other members such as a substrate at the outside thereof.

Figure 48:
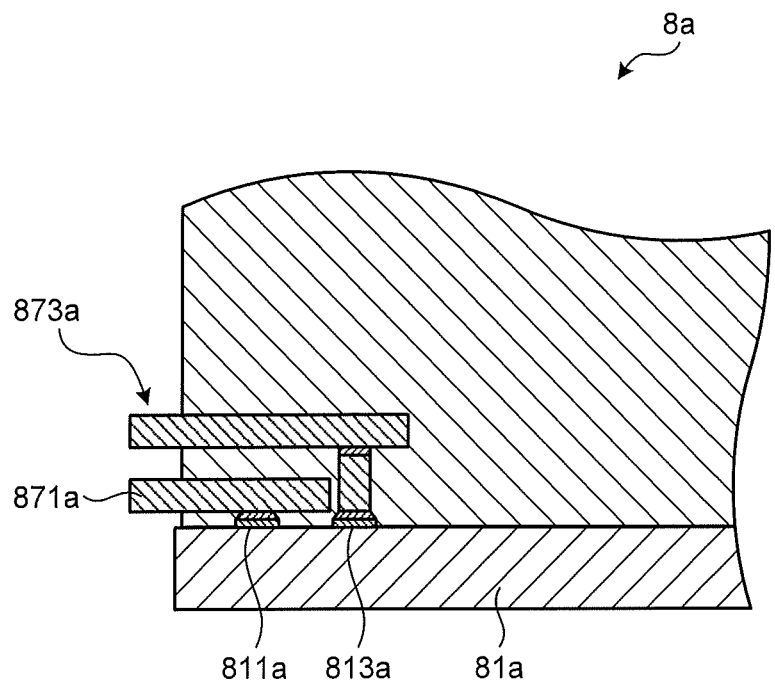
FIG. 48 is a partial sectional view of a mount assembly of an eleventh embodiment.
Figure 49:
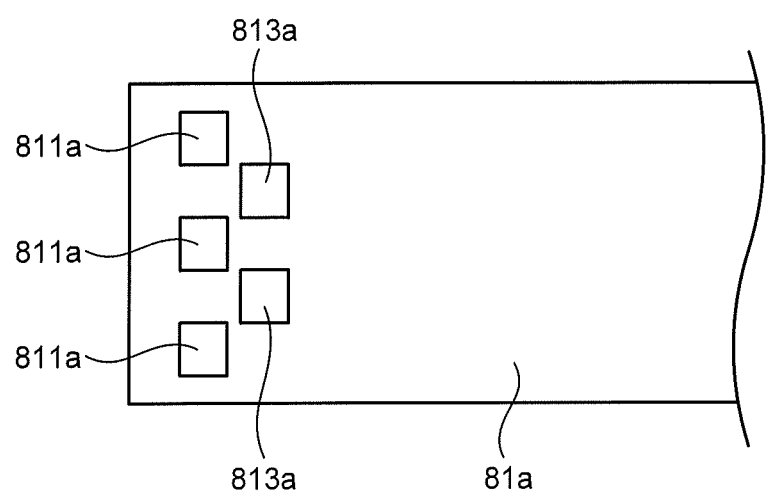
FIG. 49 is an explanatory view which illustrates position arrangement of member connecting electrodes formed on a first substrate in the eleventh embodiment.
Figure 50:
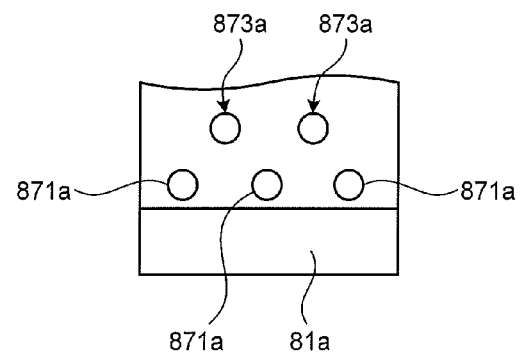
FIG. 50 is a side view of the mount assembly viewing from one end side of the first substrate.

FIG. 48 is a partial sectional view of the vicinity of inter-member connection members 871a, 873a of a mount assembly 8a of the eleventh embodiment. FIG. 49 is an explanatory view illustrating position arrangement of member connecting electrodes 811a, 813a formed on a first substrate 81a. FIG. 50 is a side view of the mount assembly 8a viewing from one end side of the first substrate 81a. Mount components (not illustrated) are mounted on the upper face as a main face of the first substrate 81a of the mount assembly 8a of the eleventh embodiment. As illustrated in FIG. 48, the member connecting electrodes 811a, 813a are formed at predetermined positions of the one end side of the upper face while avoiding the mount components. Specifically, as illustrated in FIG. 49, a plurality (i.e., five in the example of FIG. 49) of member connecting electrode 811a, 813a arranged adjacently in two lines are formed at the one end side of the upper face of the first substrate 81a. The inter-member connection members 871a are respectively connected to three of the member connecting electrodes 811a on the outer row and the inter-member connection members 873a are respectively connected to two of the member connecting electrodes 813a on the inner row. The height of the inter-member connection member 873a is determined so as not to cause interference between parallel portions of the inter-member connection members 871a and the inter-member connection members 873a in the vertical direction. As illustrated in FIG. 50, viewing the mount assembly 8a from the one end side of the first substrate 81a, the inter-member connection members 871a, 873a are adjacently arranged so that the height of the parallel portions from the main face of the first substrate 81a is alternately to be high and to be low. Here, not limited to the combination of the inter-member connection members 871a, 873a as illustrated in FIG. 48, the connection members described in the ninth embodiment and modified examples 1 to 3 can be utilized as being appropriately combined for the combination of connection members having different height of each parallel portion from the main face of the first substrate 81a.

Figure 51:
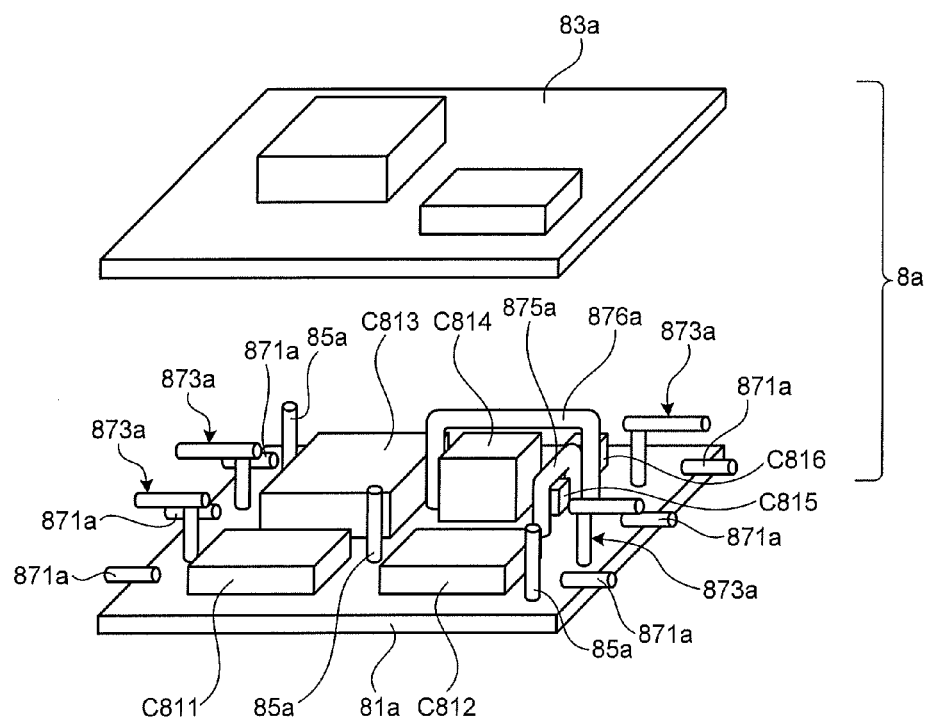
FIG. 51 is an explanatory schematic perspective view which illustrates the entire configuration of the mount assembly of the eleventh embodiment.

FIG. 51 is a schematic perspective view illustrating the entire configuration of the mount assembly 8a of the eleventh embodiment. As illustrated in FIG. 51, a plurality of mount components C811 to C816 and an inter-substrate connection member 85a to connect the first substrate 81a to a second substrate 83a are mounted on the first substrate 81a of the mount assembly 8a. As described with reference to FIGS. 48 to 50, two types of the inter-member connection members 871a, 873a are arranged at the one end of the first substrate 81a and are connected respectively to the member connecting electrodes (not illustrated) on the first substrate 81a. Similarly, two types of the inter-member connection members 871a, 873a are also arranged at the other end of the first substrate 81a and are connected respectively to the member connecting electrodes (not illustrated) on the first substrate 81a. Further, U-shaped inter-electrode connection members 875a, 876a respectively having different height are arranged on the first substrate 81a. Specifically, the respective inter-electrode connection members 875a, 876a are arranged as the parts formed to be parallel to the main face of the first substrate 81a as being sterically intersected above the mount components C814, C815 so as to connect the electrodes (not illustrated) as the connecting target formed on the first substrate 81a. Then, the first substrate 81a is connected to the second substrate 83a arranged to be opposed thereto by the inter-substrate connection member 85a. The mount assembly 8a is modularized by filling resin between the first substrate 81a and the second substrate 83a and performing polishing and the like on the end faces thereof. Here, not limited to the short side of the first substrate 81a, it is also possible to form member connecting electrodes at an end of the long side and to connect other members such as a substrate at the outside thereof.

As described above, according to the mount assembly 8a of the eleventh embodiment, it is possible to arrange the parallel portions of the adjacent inter-member connection members 871a, 873a with a small pitch in the case of connecting the plurality of inter-member connection members 871a, 873a while obtaining similar effects to those of the ninth embodiment. Accordingly, miniaturization of the mount assembly 8a can be achieved. Further, as described with reference to FIG. 51, the electrodes on the first substrate 81a can be sterically connected by utilizing appropriate combination of the connection members 875a, 876a respectively having different height of the portion which is parallel to the main face of the first substrate 81a. With this configuration, the space above the first substrate 81a can be effectively utilized and miniaturization can be achieved. In addition, compared to a case of connecting by forming a wiring pattern on a substrate, reliable connection can be actualized at low resistance.

Figure 52A:
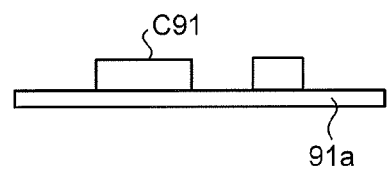
FIG. 52A is an explanatory view which illustrates a process of a method for mount assembly manufacturing of a twelfth embodiment.
Figure 52B:
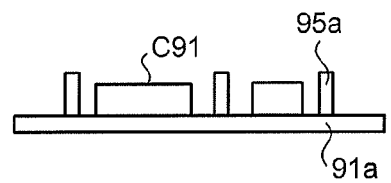
FIG. 52B is an explanatory view which illustrates a process subsequent to FIG. 52A.
Figure 52C:
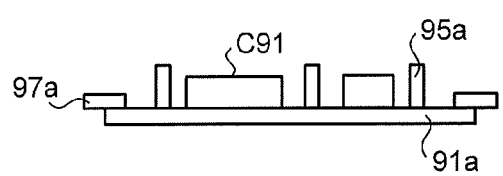
FIG. 52C is an explanatory view which illustrates a process subsequent to FIG. 52B.
Figure 52D:
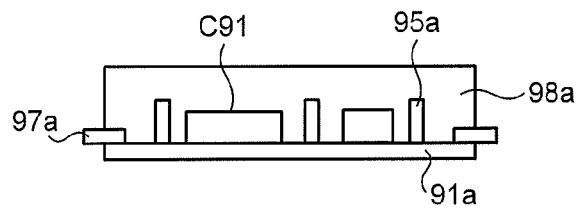
FIG. 52D is an explanatory view which illustrates a process subsequent to FIG. 52C.
Figure 52E:
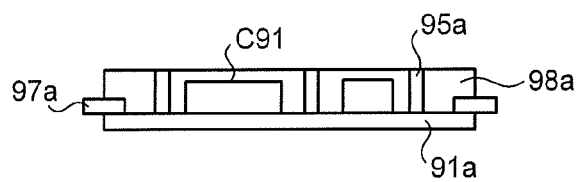
FIG. 52E is an explanatory view which illustrates a process subsequent to FIG. 52D.
Figure 52F:
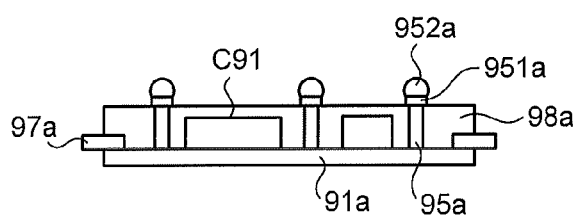
FIG. 52F is an explanatory view which illustrates a process subsequent to FIG. 52E.

The twelfth embodiment relates to a method for manufacturing a mount assembly. FIGS. 52A to 52F are explanatory views illustrating respective processes of the method for mount assembly manufacturing in the twelfth embodiment. In the method for mount assembly manufacturing, first, a mount component connecting electrode (not illustrated) for mounting the mount component C91, a substrate connecting electrode (not illustrated) and a member connecting electrode (not illustrated) are formed on predetermined positions of the upper face as a main face of a first substrate 91a. Next, the mount component C91 is mounted at the mount component connecting electrode by soldering and the like, as illustrated in FIG. 52A. Next, one end face of an inter-substrate connection member 95a is connected to the substrate connecting electrode formed on the upper face as being vertically arranged thereon, as illustrated in FIG. 52B. Next, one end of an inter-member connection member 97a is connected to the member connecting electrode substrate formed on the upper face at a side end of the first substrate 91a while the inter-member connection member 97a is arranged so that the longitudinal direction thereof is parallel to the first substrate 91a and the other end thereof is extended to the outside of the corresponding side end of the first substrate 91a, as illustrated in FIG. 52C. Next, the mount component C91, the inter-substrate connection member 95a and the inter-member connection member 97a are sealed with resin by forming a protection layer 98a, as illustrated in FIG. 52D. Next, the upper face of the protection layer 98a is polished to be planarized and the other end face of each inter-substrate connection member 95a is exposed, as illustrated in FIG. 52E. Then, a metallic film 951a is formed at the other end of the exposed inter-substrate connection member 95a and a bump 952a is formed on the metallic film 951a, as illustrated in FIG. 52F. Subsequently, being not illustrated, a second substrate (not illustrated) is arranged to be opposed to the first substrate 91a via the bump 952a so as to obtain mechanical and electrical connection. According to the present method for mount assembly manufacturing, opposed members can be reliably connected even when the length of the inter-substrate connection member 95a cannot be accurately determined.

Figure 53:
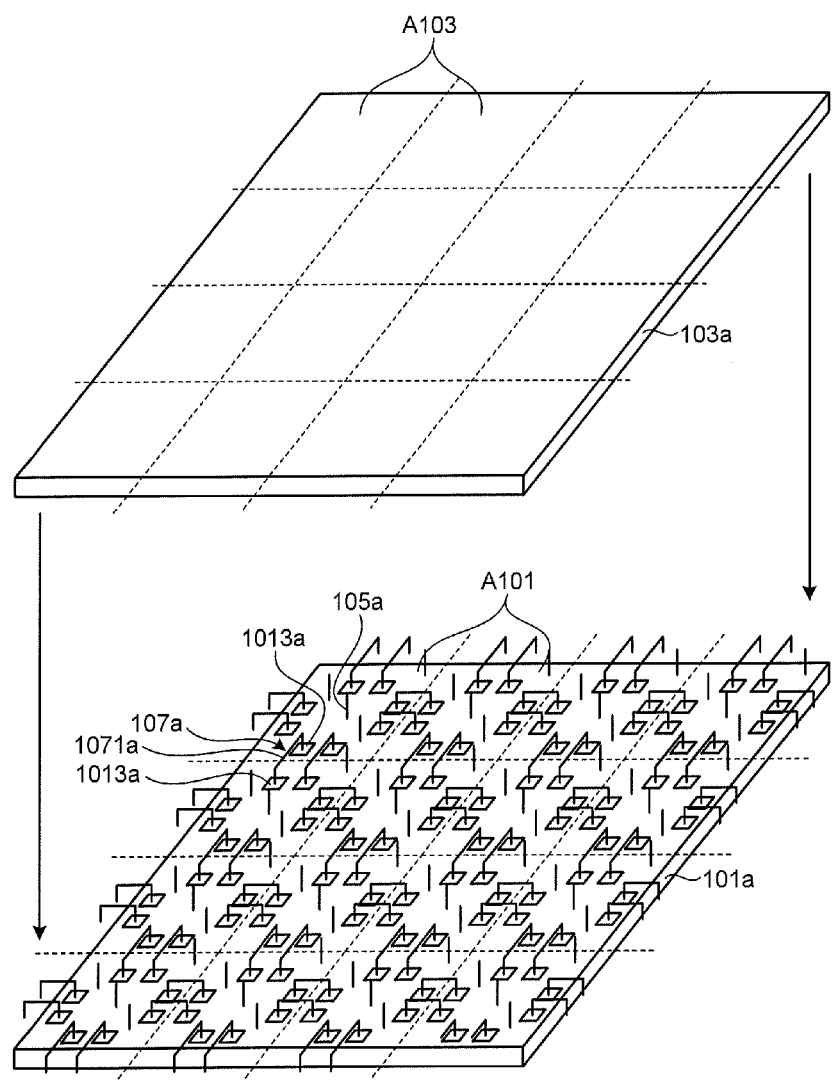
FIG. 53 is an explanatory view which illustrates a principle of a method for mount assembly manufacturing of a thirteenth embodiment.

By the way, in the description of the twelfth embodiment, the mount assembly is produced (i.e., manufactured) as a single body. However, a method for manufacturing a mount assembly is not limited to this. FIG. 53 is an explanatory view illustrating a principle of the method for mount assembly manufacturing according to the thirteenth embodiment.

In the present method for manufacturing, a plurality of mount assemblies are simultaneously produced. On the main face of a single substrate 101a as the first substrate, inter-substrate connection members 105a are mounted while mount components (not illustrated) are mounted on each section area A101 defined by cutting positions as illustrated by dashed lines in FIG. 53. Similarly, on the main face of a single substrate 103a as the second substrate, mount components (not illustrated) are mounted on each section area A103 defined by cutting positions as illustrated by dashed lines in FIG. 53. In the present method for mount assembly manufacturing, member connecting electrodes 1013a, 1013a respectively having one end of the inter-member connection member connected are formed on the main face of the substrate 101a sandwiching the cutting position as being opposed to each other. In the example of FIG. 53, two couples of opposed member connecting electrodes 1013a, 1013a are formed respectively at an end of each section area A101 as sandwiching each side. Then, a member 107a having a pillar-shaped portion 1071a to be an inter-member connection member when individuated into respective mount assemblies is placed between the opposed member connecting electrodes 1013a, 1013a. The pillar-shaped portion 1071a forms a parallel portion of the inter-member connection member and the member 107a is arranged so that the pillar-shaped portion 1071a passes over the cutting position. Then, after performing processes of connecting the substrates 101a, 103a by an inter-substrate connection member 105a, arranging a protection layer and the like, the modularized mount assembly can be obtained by being individuated as being cut at the cutting position for the last time.

Figure 54A:
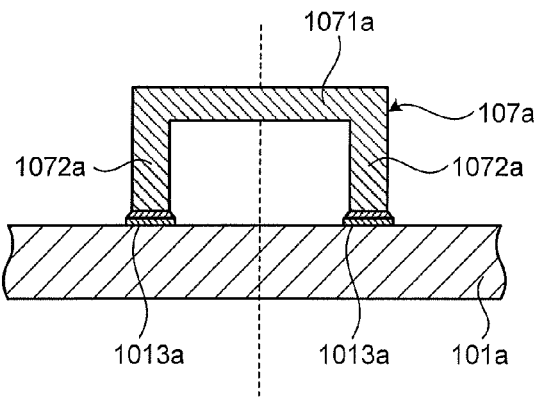
FIG. 54A is an explanatory view which illustrates a specific example of a process of the method for mount assembly manufacturing of the thirteenth embodiment.
Figure 54B:
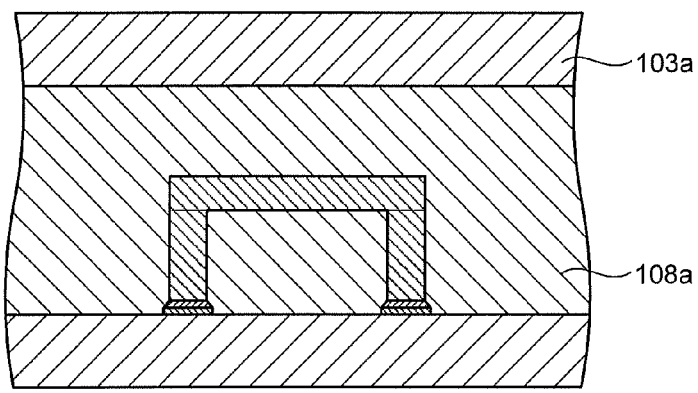
FIG. 54B is an explanatory view which illustrates a specific example of a process subsequent to FIG. 54A.
Figure 54C:
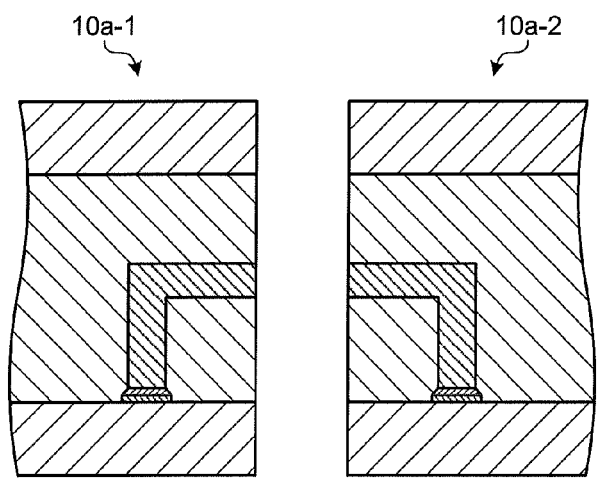
FIG. 54C is an explanatory view which illustrates a specific example of a process subsequent to FIG. 54B.
Figure 55:
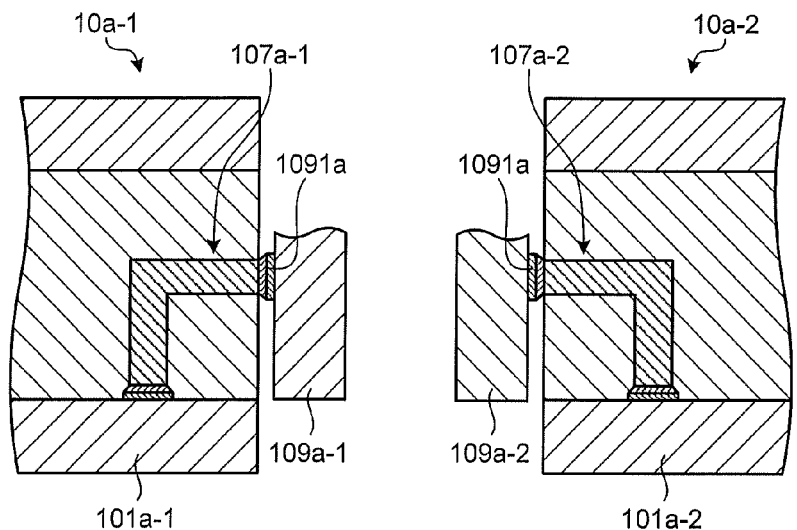
FIG. 55 is a partial sectional view which illustrates a state that a substrate is connected to the mount assembly manufactured by the method for manufacturing of FIGS. 54A to 54C.

FIGS. 54A to 54C are explanatory views illustrating a specific example of respective processes in the present method for mount assembly manufacturing. FIG. 55 is a partial sectional view illustrating a state that substrates as other members are connected to the manufactured mount assembly. Following description is performed having a case to obtain a mount assembly to which the inter-member connection member 47a of modified example 3 is applied as an example. In this description, mount components and inter-substrate connection member (not illustrated) are previously mounted on the main face of the substrate 101a. As illustrated in FIG. 54A, the member connecting electrodes 1013a, 1013a are formed at the positions being opposed to each other sandwiching the cutting position indicated by a dashed line in FIG. 54A on the main face of the substrate 101a (i.e., an electrode forming process). Next, proceeding to a connecting process, the member 107a having a U-shaped external shape in which support portions 1072a, 1072a are integrally formed at both ends of the pillar-shaped portion 1071a forming a parallel portion is prepared in the present method for manufacturing. In the connecting process, the proximal ends of the respective support portions 1072a, 1072a are connected respectively to the opposed member connecting electrode sandwiching the cutting position as being vertically arranged thereon while the pillar-shaped portion 1071a is arranged to be parallel to the main face of the substrate 101a. Next, proceeding to an arranging process, a protection layer 108a is formed by filling resin onto the substrate 101a, as illustrated in FIG. 54B. Then, proceeding to an individuating process after a connecting process of the second substrate 103a, mount assemblies 10a-1, 10a-2 are obtained by individuating with dicing, as illustrated in FIG. 54C.

As illustrated in FIG. 55, the mount assemblies 10a-1, 10a-2 manufactured as described above are connected to substrates 109a-1, 109a-2 as other members respectively having a mount assembly connecting electrode 1091a formed on a main face being similar to the above-mentioned embodiments. Specifically, the substrate 109a-1 is arranged so that the left side face in FIG. 55 as a main face is directed to a first substrate 101a-1 side and the main face thereof is perpendicular to the main face of the first substrate 101a-1 at the outside of one end of the first substrate 101a-1. Then, the mount assembly connecting electrode 1091a of the substrate 109a-1 is connected to the other end face of an inter-member connection member 107a-1 extended to the outside of the one end of the first substrate 101a-1, so that the mount assembly 10a-1 and the substrate 109a-1 are mechanically and electrically connected. Similarly, the substrate 109a-2 is arranged so that the right side face in FIG. 55 as a main face is directed to a first substrate 101a-2 side and the main face thereof is perpendicular to the main face of the first substrate 101a-2 at the outside of one end of the first substrate 101a-2. Then, the mount assembly connecting electrode 1091a of the substrate 109a-2 is connected to the other end face of an inter-member connection member 107a-2 extended to the outside of the one end of the first substrate 101a-2, so that the mount assembly 10a-2 and the substrate 109a-2 are mechanically and electrically connected.

As described above, according to the method for mount assembly manufacturing of the thirteenth embodiment, cost for manufacturing can be reduced and productivity can be improved since a plurality of mount assemblies can be produced at one time.

In the above description, the inter-member connection member having the configuration described in modified example 3 is adopted. However, the inter-member connection members of other configurations described in the ninth embodiment and modified examples 1 and 2 can be also adopted similarly. For example, in the case that the connection member having the configuration described in modified example 1 is adopted, one end face of each second pillar-shaped member which is vertically arranged is connected to the opposed member connecting electrode sandwiching the cutting position in the connecting process. Then, a single pillar-shaped member corresponding to the pillar-shaped portion is arranged to be parallel to a main face of a substrate to be the first substrate and the side face of each of both ends are connected to the other end face of the second pillar-shaped member. In the case of the method for manufacturing in the thirteenth embodiment, the process to connect the second pillar-shaped member and the pillar-shaped member is unnecessary unlike the present modified example. Therefore, the number of processes for manufacturing can be reduced.

Figure 56:
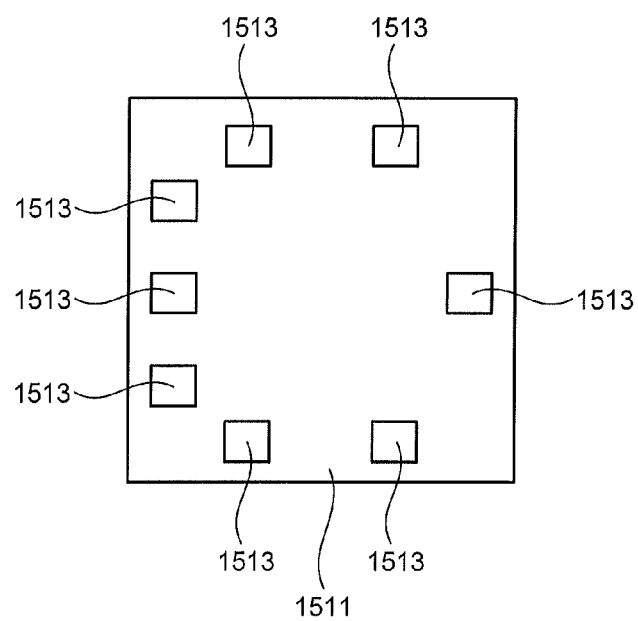
FIG. 56 is a view which illustrates a modified example of position arrangement of member connecting electrodes formed on a substrate.
Figure 57:
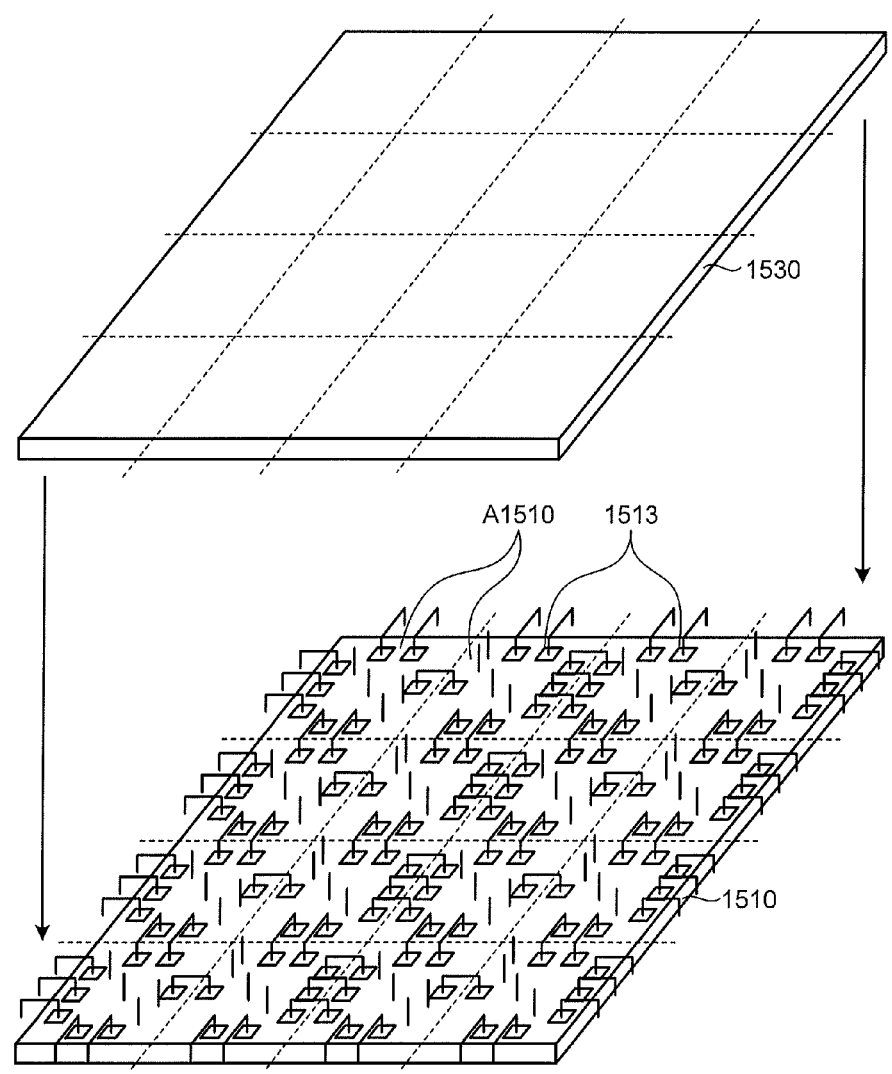
FIG. 57 is an explanatory view which illustrates a principle of a method for mount assembly manufacturing of the modified example.

Further, in the description of the thirteenth embodiment, the member connecting electrodes are formed in the same number (i.e., two) at each end on the substrate constituting the mount assembly. However, the number of the member connecting electrodes formed at each end can be appropriately set. FIG. 56 is a view illustrating a modified example of position arrangement of the member connecting electrodes formed on the substrate. FIG. 57 is an explanatory view illustrating a principle of a method for manufacturing the mount assembly of the present modified example.

As illustrated in FIG. 56, on a main face of the mount assembly manufactured by the method for manufacturing of the present modified example, three member connecting electrodes 1513 are formed at the left end of a substrate 1511 in FIG. 56 and one member connecting electrode 1513 is formed at the right end. In addition, two member connecting electrodes 1513 are formed respectively at the upper end and lower end. In the connecting process of this case, as illustrated in FIG. 57, the respective member connecting electrodes 1513 are formed on a substrate 1510 so that positions of the member connecting electrodes 1513 formed at adjacent section areas A1510 are to be mutually axisymmetric sandwiching a cutting position indicated by a dashed line in FIG. 57. Then, after the substrates 1510, 1530 are connected, separation (i.e., individuation) is performed by cutting at the cutting positions for the last time. With this configuration, simultaneous producing can be performed even in the case that the number (including zero) of the member connecting electrodes to be formed at the end of the substrate differs for each end. More specifically, the simultaneous producing can be performed even in the case that the number of the member connecting electrodes formed at one opposed end is not the same, as long as the number of the member connecting electrodes formed at the other opposed end is the same.

Figure 58:
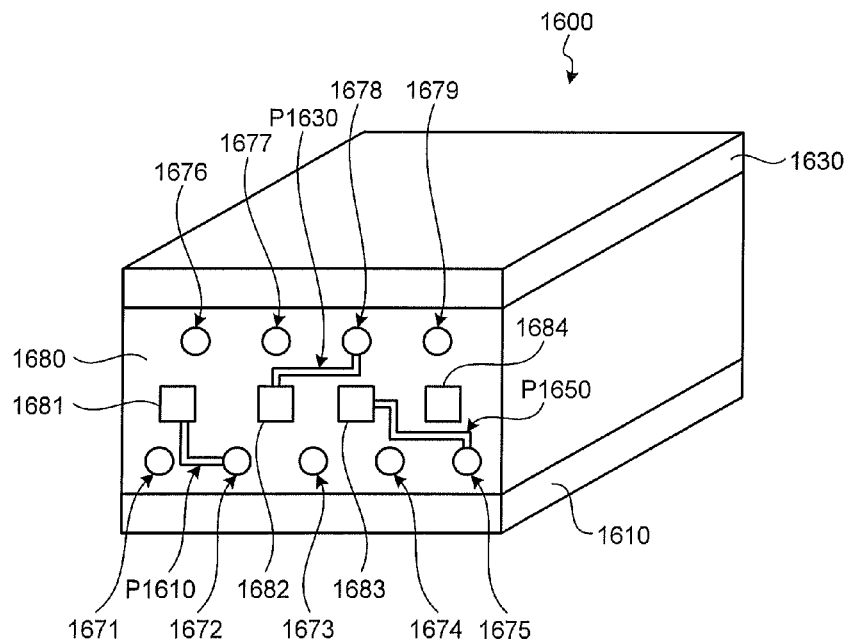
FIG. 58 is a schematic perspective view which illustrates the entire configuration of a mount assembly of a fourteenth embodiment.

FIG. 58 is a schematic perspective view illustrating the entire configuration of a mount assembly 1600 of the fourteenth embodiment. In the mount assembly 1600 of FIG. 58, a plurality (i.e. nine in the example of FIG. 58) of other ends of inter-member connection members 1671 to 1679 (specifically, other ends of parallel portions formed at the inter-member connection members 1671 to 1679) are exposed at an end face of a protection layer 1680 between a first substrate 1610 and a second substrate 1630. Then, a plurality (i.e., four in the example of FIG. 58) of side face connecting electrodes 1681 to 1684 are formed at the end face, so that the side face connecting electrodes 1681 to 1684 are connected to other members respectively having a mount assembly connecting electrode formed on a main face thereof. Specifically, the other end of the inter-member connection member 1672 and the side face connecting electrode 1681 are connected via a wiring pattern P1610. The other end of the inter-member connection member 1678 and the side face connecting electrode 1682 are connected via a wiring pattern P1630. The other end of the inter-member connection member 1675 and the side face connecting electrode 1683 are connected via a wiring pattern P1650. Here, the wiring patterns P1610, P1630, P1650 are formed at the end face of the protection layer 1680. The wiring patterns P1610, P1630, P1650 can be formed by appropriately utilizing a thin-film method, an ink-jet method and the like, for example. At that time, it is also possible to form an insulating protection film at a part of the end face of the protection layer 1680 other than the side face connecting electrodes 1681 to 1684.

According to the fourteenth embodiment, since the side face connecting electrodes 1681 to 1684 to be connected to other members can be formed at the end face of the protection layer 1680, connecting positions in the mount assembly 1600 with other members can be flexibly adjusted and design flexibility can be increased.

Figure 59:
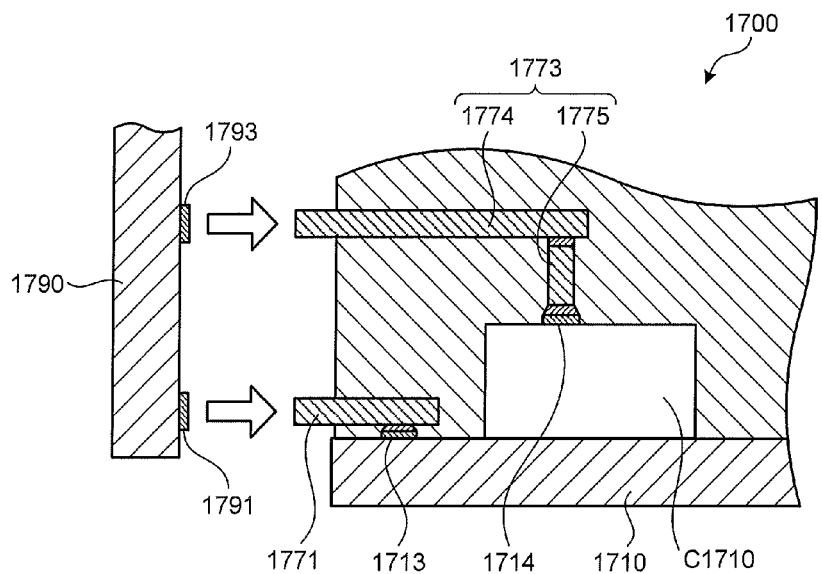
FIG. 59 is a partial sectional view of a mount assembly having an inter-member connection member of a modified example.

In the above description of the ninth to fourteenth embodiments and modified examples, the member connecting electrode formed on the substrate constituting the mount assembly and the mount assembly connecting electrode formed on the substrate as another member are connected. However, the present invention is not limited to this. FIG. 59 is a partial sectional view of the vicinity of inter-member connection members 1771, 1773 illustrating a scene to connect a substrate 1790 as another member to a mount assembly 1700 having the inter-member connection members 1771, 1773 of the present modified example. The substrate 1790 is arranged so that the right side face in FIG. 59 as a main face thereof is directed to a first substrate 1710 side and the main face thereof is perpendicular to the main face of the first substrate 1710 at the outside of the one end of the first substrate 1710.

The inter-member connection member 1771 is constituted similarly to the inter-member connection member 17a of the ninth embodiment and one end thereof is connected to a member connecting electrode 1713 on the first substrate 1710. Meanwhile, the inter-member connection member 1773 is constituted similarly to the inter-member connection member 27a of modified example 1. In the present modified example, one end face of a second pillar-shaped member 1775 of the inter-member connection member 1773 is connected to a member connecting electrode 1714 formed on a main face of a mount component C1710. Then, a first pillar-shaped member 1774 is arranged so that the longitudinal direction thereof is parallel to the main face of the first substrate 1710 (i.e., parallel to the main face of the mount component C1710) and the other end thereof is extended to the outside of the one end of the first substrate 1710. Then, similar to the abovementioned embodiments, the mount assembly 1700 is connected to the substrate 1790 as another member having mount assembly connecting electrodes 1791, 1793 formed on the main face thereof. Here, the length of the second pillar-shaped member 1775 of the inter-member connection member 1773 is determined in accordance with the position of the mount assembly connecting electrode 1793 of the first substrate 1710 connected to the member connecting electrode 1714 by the inter-member connection member 1773 (i.e., in accordance with the height of the mount assembly connecting electrode 1793 of the first substrate 1710 against the main face position of the mount component C1710 where the member connecting electrode 1714 is formed).

In the above description of the embodiments and modified examples, the other end face of the parallel portion formed at the connection member is connected to the mount assembly connecting electrode formed at another member such as the substrate. However, the present invention is not limited to this. In the following, a modified example will be described having a connection member of a similar configuration to the connection member of modified example 3 as an example. Here, the connection members of the other configurations described in the ninth embodiment and modified examples 1 and 2 may be similarly adopted.

Figure 60:
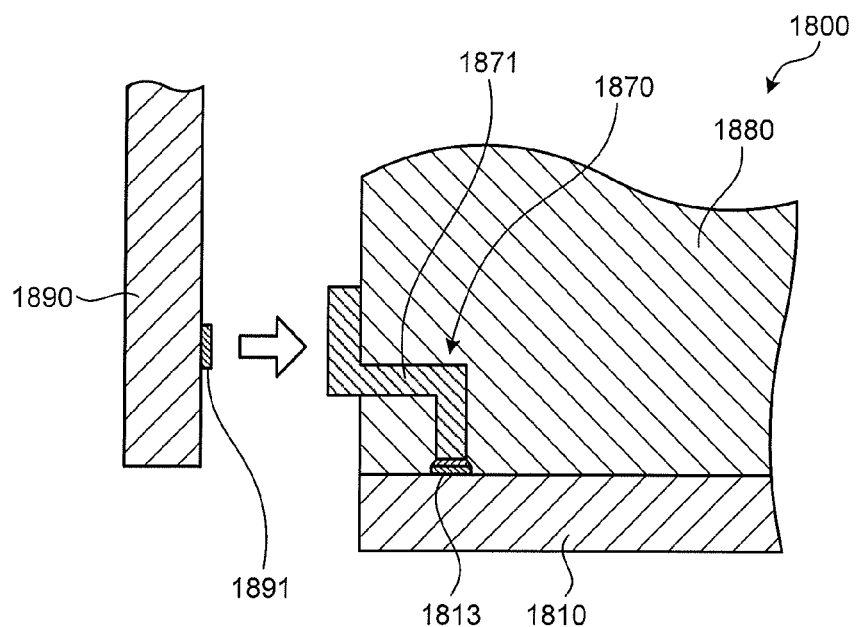
FIG. 60 is an explanatory view which illustrates a modified example of the method for connecting the other end side of a parallel portion formed on an inter-member connection member and a mount assembly connecting electrode.

FIG. 60 is an explanatory view of a modified example of a connection method between the other end side of a parallel portion 1871 formed at an inter-member connection member 1870 and a mount assembly connecting electrode 1891 of a substrate as another member. In the example of FIG. 60, the proximal end of the inter-member connection member 1870 is connected to a member connecting electrode 1813 and a protection layer 1880 is formed by filling resin onto a first substrate 1810. Subsequently, a projection portion at the distal end side of the parallel portion 1871 of the inter-member connection member 1870 is folded upward, for example, along an end face of the protection layer 1880. A mount assembly 1800 is connected to a substrate 1890 as another member where the mount assembly connecting electrode 1891 is formed. Specifically, a side face of the other end of the folded parallel portion 1871 is connected to the mount assembly connecting electrode 1891. With this configuration, compared to a case of connecting the other end face of the parallel portion 1871 to the mount assembly connecting electrode 1891, the connection area of the parallel portion 1871 against the mount assembly connecting electrode 1891 can be widely ensured, so that the connection strength therebetween can be enhanced.

Figure 61:
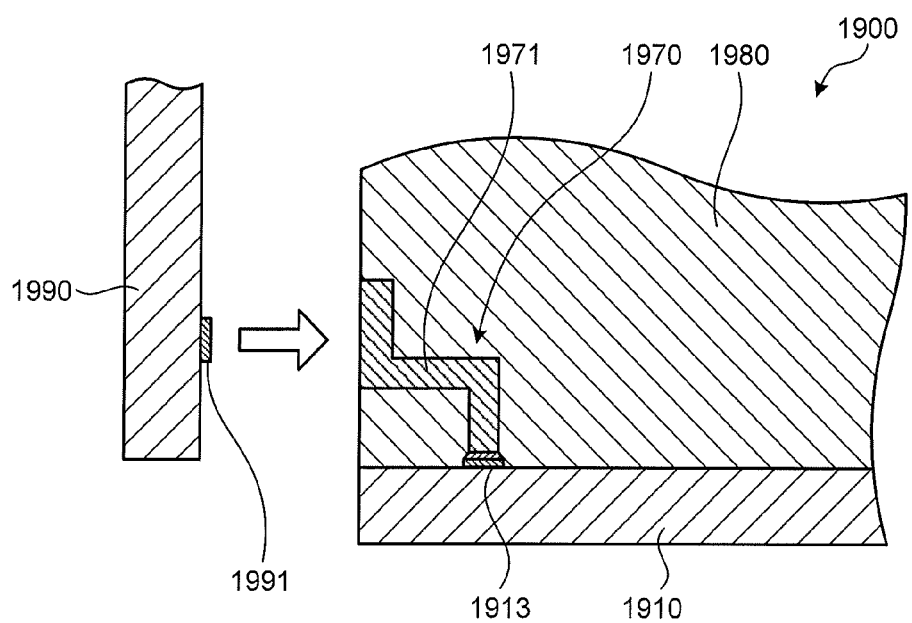
FIG. 61 is an explanatory view which illustrates another modified example of the method for connecting the other end side of a parallel portion formed on an inter-member connection member and a mount assembly connecting electrode.

FIG. 61 is an explanatory view of another modified example of a connection method between the other end side of a parallel portion 1971 formed at an inter-member connection member 1970 and a mount assembly connecting electrode 1991 of a substrate as another member. In the example of FIG. 61, the other end side of the parallel portion 1971 is folded upward, for example, after the proximal end of the inter-member connection member 1970 is connected to a member connecting electrode 1913. Subsequently, a protection layer 1980 is formed by filling resin onto a first substrate 1910 and a side face of the other end of the parallel portion 1971 is exposed by polishing an end face of the protection layer 1980 at one end side of the first substrate 1910. A mount assembly 1900 is connected to a substrate 1990 as another member where the mount assembly connecting electrode 1991 is formed. Specifically, the side face of the other end of the exposed parallel portion 1971 is connected to the mount assembly connecting electrode 1991. Similarly in this case, the connection area of the parallel portion 1971 against the mount assembly connecting electrode 1991 can be widely ensured, so that the connection strength therebetween can be enhanced.

Here, in the abovementioned ninth to eleventh embodiments and modified examples 1 to 4, the other end of the parallel portion formed at the connection member is extended to the outside of the one end of the upper face of the substrate constituting the mount assembly. However, the other end of the parallel portion is only required to be extended at least to the one end edge of the upper face of the substrate. In this case, an end face of a protection layer at one end side of the substrate is to be polished after forming the protection layer by filling resin onto the substrate, for example. In this manner, the other end face of the parallel portion may be exposed from a side face at the one end side of the mount assembly.

Further, in the above description of embodiments and modified examples, the member connecting electrodes are formed at the first substrate located at the lower side and inter-member connection members are connected thereto among the substrates constituting the mount assembly by being arranged to be mutually opposed. However, it is also possible to form member connecting electrodes and connects inter-member connection members thereto similarly at the second substrate of the upper side.

Further, in the abovementioned embodiments and modified examples, the protection layer is formed by filling resin between the first and second substrates which are arranged to be mutually opposed. However, it is also possible to seal with resin the vicinity of connecting position between the inter-substrate connection member and the substrate connecting electrode of the first substrate, the vicinity of the connecting position between the inter-substrate connection member and the substrate connecting electrode of the second substrate, and the vicinity of the connecting position between the inter-member connection member and the member connecting electrode.

Further, the first and second substrates and the substrates described as examples of other members may be interconnection substrates respectively having a wiring pattern formed or may be substrates respectively having an electronic circuit and the like mounted inside.

In the description of the abovementioned embodiments and modified examples, the substrate is connected to the mount assembly. However, another member to be the connection target is not limited to a substrate. For example, the present invention can be applied to a case that a member such as an electronic component and an electronic circuit module is arranged so that a main face thereof is perpendicular to a main face of the substrate and is connected thereto.

In the mount assembly according to the present invention, one end side of the parallel portion of the connection member arranged to be parallel to the main face of the member is connected to the member connecting electrode formed on the main face of the member. Then, another member of which main face is perpendicular to the main face of the member can be connected to the other end side of the parallel portion. Accordingly, another member can be easily connected to the mount assembly in high density.

Further, in the mount assembly according to the present invention, a plurality of substrates arranged as the respective main faces thereof are mutually parallel are connected by the inter-substrate connection member. One end side of the parallel portion of the inter-member connection member is connected to the member connecting electrode formed on the substrate main face of at least one substrate among these substrates while being arranged so that the other end side is extended to the end of the member main face and the longitudinal direction thereof is parallel to the substrate main face. Then, the member arranged so that the main face thereof is perpendicular to the substrate main face can be connected to the other end side of the parallel portion. Accordingly, another member can be easily connected to the mount assembly in high density.

The above and other features, advantages and technical and industrial significance of this invention will be better understood by reading the following detailed description of presently preferred embodiments of the invention, when considered in connection with the accompanying drawings.

What is claimed is:

1. A method for manufacturing a mount assembly comprising:
    forming a first member connecting electrode on a first portion of a main face of a member to which one or more mount components are mounted;
    forming a second member connecting electrode on a second portion of the main face of the member to oppose the first member connecting electrode across a cutting line for subsequently dividing the member into the first and second portions;
    arranging a connection member having first and second pillar-shaped portions and a parallel portion, each of the first and second pillar-shaped portions having a first end connecting to a respective one of the first and second connecting electrodes and a second end extending from the respective first and second connecting electrodes, the parallel portion being parallel to the main face of the member to connect the free ends of the first and second pillar-shaped portions to each other, thereby connecting the first and second member connecting electrodes to each other; and
    dividing the member and the parallel portion by cutting at the cutting line to separate the member into the first and second portions.

2. The method for manufacturing a mount assembly according to claim 1, further comprising providing support portions to support each of the pillar-shaped portions at the first ends.

3. The method for manufacturing a mount assembly according to claim 1, further comprising, subsequent to the arranging and prior to the dividing, arranging a reinforcing member at least at the vicinity of a connection between the second end of each pillar-shaped portion and the parallel portion.

4. The method for manufacturing a mount assembly according to claim 1, wherein the first and second pillar-shaped portions and the parallel portion are integrally formed in a U-shaped connection member.

* * * * *